United States Patent
Oh et al.

(10) Patent No.: US 10,879,411 B2
(45) Date of Patent: Dec. 29, 2020

(54) SOLAR CELL MODULE

(71) Applicant: LG ELECTRONICS INC., Seoul (KR)

(72) Inventors: Donghae Oh, Seoul (KR); Jinsung Kim, Seoul (KR); Hyunho Lee, Seoul (KR); Haejong Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 225 days.

(21) Appl. No.: 14/952,653

(22) Filed: Nov. 25, 2015

(65) Prior Publication Data

US 2016/0149064 A1 May 26, 2016

(30) Foreign Application Priority Data

Nov. 26, 2014 (KR) .......................... 10-2014-0166746

(51) Int. Cl.
*H01L 31/05* (2014.01)

(52) U.S. Cl.
CPC ...... *H01L 31/0508* (2013.01); *H01L 31/0504* (2013.01); *H01L 31/0516* (2013.01); *Y02E 10/50* (2013.01)

(58) Field of Classification Search
CPC ......... H01L 31/0201; H01L 31/022425; H01L 31/022433; H01L 31/0488; H01L 31/05; H01L 31/0508; H01L 31/0516
See application file for complete search history.

(56) References Cited

U.S. PATENT DOCUMENTS

| | | | |
|---|---|---|---|
| 5,476,553 A | * | 12/1995 | Hanoka ............. B32B 17/10036 136/251 |
| 5,567,248 A | | 10/1996 | Chung |
| 5,620,528 A | | 4/1997 | Schade et al. |
| 2005/0133079 A1 | | 6/2005 | Boulanger et al. |

(Continued)

FOREIGN PATENT DOCUMENTS

| CN | 202423302 U | 9/2012 |
|---|---|---|
| CN | 103794663 A | 5/2014 |

(Continued)

OTHER PUBLICATIONS

Machine translation of DE-19529306-A1. (Year: 1997).*

(Continued)

*Primary Examiner* — Mayla Gonzalez Ramos
(74) *Attorney, Agent, or Firm* — Birch, Stewart, Kolasch & Birch, LLP

(57) ABSTRACT

A solar cell module is disclosed. The solar cell module includes a plurality of solar cells each including first electrodes collecting carriers of a first conductive type and second electrodes collecting carriers of a second conductive type opposite the first conductive type, the plurality of solar cells being positioned adjacent to one another, and a plurality of wiring members configured to electrically connect the first electrodes to the second electrodes of adjacent solar cells. The plurality of wiring members are positioned in parallel with one another. The plurality of wiring members include a first wiring member disposed in a corner area of one solar cell having a corner with a curved edge and a second wiring member disposed in a non-corner area of the one solar cell except the corner area.

23 Claims, 20 Drawing Sheets

(56) References Cited

U.S. PATENT DOCUMENTS

| | | | |
|---|---|---|---|
| 2007/0295381 A1* | 12/2007 | Fujii | H01L 31/022433 136/244 |
| 2010/0000602 A1* | 1/2010 | Gray | H01L 31/022433 136/256 |
| 2011/0073165 A1 | 3/2011 | Lee | |
| 2012/0138141 A1 | 6/2012 | Kim et al. | |
| 2012/0204938 A1* | 8/2012 | Hacke | H01L 31/022441 136/246 |
| 2013/0206062 A1* | 8/2013 | Cobb | B41J 2/005 118/699 |
| 2016/0087121 A1* | 3/2016 | Seipel | H01L 31/022441 136/256 |
| 2016/0104810 A1 | 4/2016 | Adachi | |
| 2016/0284895 A1* | 9/2016 | Hashimoto | H01L 31/022425 |

FOREIGN PATENT DOCUMENTS

| | | | | |
|---|---|---|---|---|
| DE | 19529306 A1 * | 2/1997 | | H01L 31/022425 |
| JP | 6-204510 A | 7/1994 | | |
| JP | 8-116079 A | 5/1996 | | |
| JP | 2001-68699 A | 3/2001 | | |
| JP | 2003-258277 A | 9/2003 | | |
| JP | 2011-3724 A | 1/2011 | | |
| JP | 2012-119393 A | 6/2012 | | |
| JP | 2012-129359 A | 7/2012 | | |
| JP | 2013-65588 A | 4/2013 | | |
| JP | 2013-73890 A | 4/2013 | | |
| JP | 2013-527616 A | 6/2013 | | |
| JP | 2013-165268 A | 8/2013 | | |
| JP | WO 2014080894 A1 * | 5/2014 | | H01L 31/022425 |
| JP | 2014-103301 A | 6/2014 | | |
| JP | 2016-72637 A | 5/2016 | | |
| KR | 10-2012-0031088 A | 3/2012 | | |
| WO | WO 2010/150735 A1 | 12/2010 | | |
| WO | WO 2014/185225 A1 | 11/2014 | | |

OTHER PUBLICATIONS

Green, "Solar Cells: Operating Principles, Technology, and System Applications," Englewood Cliffs, NJ, Prentice-Hall, Inc., 1982 2 pages, Abstract only.

* cited by examiner

SOLAR CELL MODULE

CROSS-REFERENCE TO RELATED APPLICATION

This application claims priority to and the benefit of Korean Patent Application No. 10-2014-0166746 filed in the Korean Intellectual Property Office on Nov. 26, 2014, the entire contents of which are incorporated herein by reference.

BACKGROUND OF THE INVENTION

Field of the Invention

Embodiments of the invention relate to a solar cell module including a plurality of solar cells connected to one another using a plurality of wiring members.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted because the solar cells utilize an abundant energy source and do not cause environmental pollution.

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

When light is incident on the solar cell, a plurality of electron-hole pairs are produced in the semiconductors. The electron-hole pairs are separated into electrons and holes. The electrons move to the n-type semiconductor, for example, the emitter region, and the holes move to the p-type semiconductor, for example, the substrate. Then, the electrons and the holes are collected by the different electrodes respectively connected to the emitter region and the substrate. The electrodes are connected to each other using electric wires to thereby obtain electric power.

SUMMARY OF THE INVENTION

In one aspect, there is a solar cell module including a plurality of solar cells each including first electrodes collecting carriers of a first conductive type and second electrodes collecting carriers of a second conductive type opposite the first conductive type, the plurality of solar cells being positioned adjacent to one another, and a plurality of wiring members configured to electrically connect the first electrodes to the second electrodes of adjacent solar cells, the plurality of wiring members being positioned in parallel with one another, wherein the plurality of wiring members include a first wiring member disposed in a corner area of one solar cell having a corner with a curved edge and a second wiring member disposed in a non-corner area of the one solar cell except the corner area.

It is preferable, but not required, that a length of the first wiring member is shorter than a length of the second wiring member.

It is preferable, but not required, that the total number of first and second electrodes connected to the first wiring member is less than the total number of first and second electrodes connected to the second wiring member.

It is preferable, but not required, that an end of the first wiring member is separated from the corner by a first distance, and an end of the second wiring member is separated from an end of the one solar cell by a second distance.

It is preferable, but not required, that the first distance is equal to the second distance, and the first distance is less than a pitch of adjacent first electrodes.

Preferably, the first distance may be shorter than the second distance.

The first electrodes may be positioned on a front surface of each of the plurality of solar cells, and the second electrodes may be positioned on a back surface of each of the plurality of solar cells.

Electrode pads may be formed at crossings between the first electrodes and the plurality of wiring members or crossings between the second electrodes and the plurality of wiring members.

Unlike the above description, the first electrodes and the second electrodes may be positioned on the back surface of each of the plurality of solar cells.

In this instance, a conductive adhesive portion may be formed at crossings between the first electrodes and the plurality of wiring members electrically connected to the first electrodes, and an insulating adhesive portion may be formed at crossings between the first electrodes and the plurality of wiring members electrically connected to the second electrodes.

The plurality of wiring members connected to the second electrodes of the adjacent solar cells and the plurality of wiring members connected to the first electrodes may be connected to each other through a connection bar. In this instance, the connection bar may be positioned between the adjacent solar cells.

The connection bar may extend in a longitudinal direction crossing a longitudinal direction of the plurality of wiring members connected to the second electrodes and a longitudinal direction of the plurality of wiring members connected to the first electrodes.

The non-corner area of the one solar cell may be positioned in a middle of a semiconductor substrate of the one solar cell, and the corner areas of the one solar cell may be positioned on both sides of the non-corner area in the semiconductor substrate. A length of the semiconductor substrate in the corner area may be shorter than a length of the semiconductor substrate in the non-corner area.

At least one wiring member connected to the one first electrode and at least one wiring member connected to the one second electrode may be positioned in the corner area.

Each of the plurality of wiring members may have a wire shape having a circular cross section or a ribbon shape having a rectangular cross section.

The one first electrode, which exists between an end of one second wiring member and an end of the one solar cell and is not connected to one first wiring member or the second wiring member, is connected to another first electrode connected to the one second wiring member through a connection bar.

It is preferable, but not required, that the solar cell module further includes a plurality of first pads disposed at crossings of the first electrodes and the first wiring members in the corner area, and a plurality of second pads disposed at crossings of the first electrodes and the second wiring members in the non-corner area. An end of one first wiring member is fixed to an outermost pad, which is positioned closest to the end of the one solar cell among the plurality of first pads, and an end of the one second wiring member is fixed to an outermost pad, which is positioned closest to the end of the one solar cell among the plurality of second pads.

It is preferable, but not required, that a first outermost pad, to which the one first wiring member is fixed, is separated from the corner by a third distance, and a second outermost pad, to which the one second wiring member is fixed, is separated from the end of the solar cell by a fourth distance.

It is preferable, but not required, that the third distance is equal to the fourth distance. In this instance, each of the third distance and the fourth distance is 5 mm to 15 mm.

It is preferable, but not required, that the third distance is shorter than the fourth distance, and the first outermost pad and the second outermost pad are positioned on the same line based on an extension direction of the first electrodes.

It is preferable, but not required, that the plurality of first pads are connected to one another through a plurality of connection electrodes, and the plurality of second pads are connected to one another through the plurality of connection electrodes.

It is preferable, but not required, that the plurality of connection electrodes are connected to all of the first electrodes existing in each of the corner area and the non-corner area.

It is preferable, but not required, that one connection electrode connects at least one first electrode, which exists between the outermost pad and the end of the one solar cell, to the outermost pad.

It is preferable, but not required, that the solar cell module further includes a link electrode configured to extend in an oblique direction and connect at least one first electrode, which exists between the outermost pad and the end of the one solar cell, to the outermost pad.

It is preferable, but not required, that the number of a plurality of second wiring members is at least five times more than the number of a plurality of first wiring members.

It is preferable, but not required, that each of the plurality of wiring members is positioned in the middle of each of areas obtained by dividing a width of the one solar cell into the total number of the plurality of wiring members.

In the embodiment of the invention, the plurality of wiring members are disposed in the corner area of the one solar cell having the corner, and thus carriers may be uniformly collected from the entire part of the one solar cell.

In the embodiment of the invention, because the length of the plurality of wiring members disposed in the corner area is shorter than the length of the plurality of wiring members disposed in the non-corner area, a short circuit of the plurality of wiring members in the corner area may be prevented.

In the embodiment of the invention, when the solar cell module, in which the length of the plurality of wiring members disposed in the non-corner area is equal to the length of the plurality of wiring members disposed in the corner area, is manufactured, all of the plurality of wiring members may be cut at a time.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. It will be noted that a detailed description of known arts will be omitted if it is determined that the detailed description of the known arts can obscure the embodiments of the invention.

Wherever possible, the same reference numbers will be used throughout the drawings to refer to the same or like parts. The same or like parts are not repeatedly described.

Figure 1:
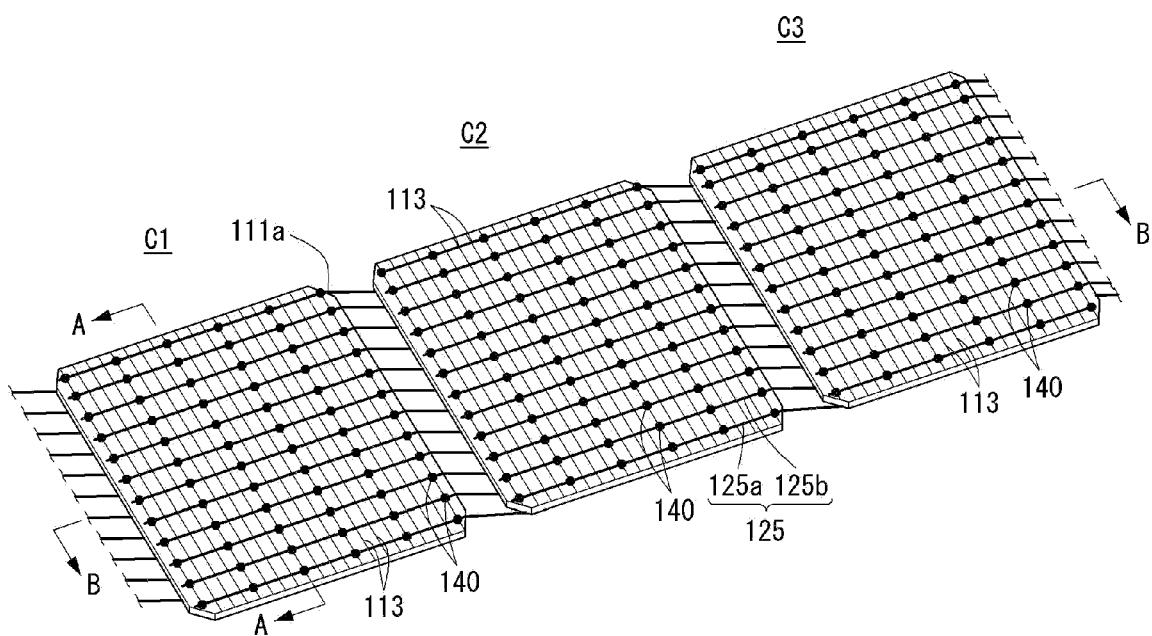
FIG. 1 shows an entire shape of a solar cell module according to an example embodiment of the invention.
Figure 2:
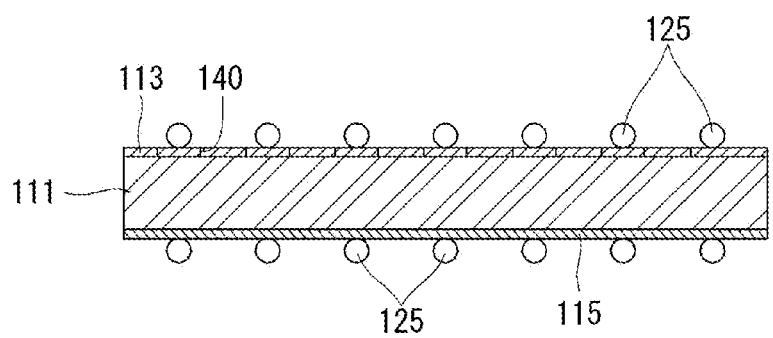
FIG. 2 is a cross-sectional view taken along line A-A of FIG. 1.
Figure 3:
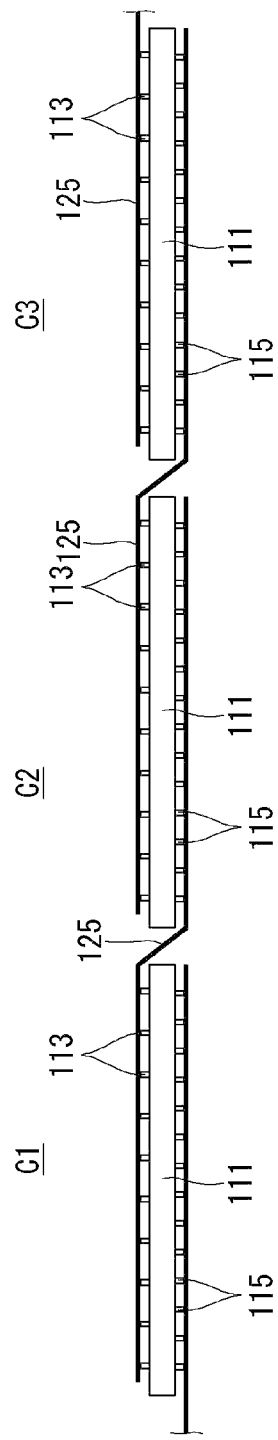
FIG. 3 is a cross-sectional view taken along line B-B of FIG. 1.
Figure 4:
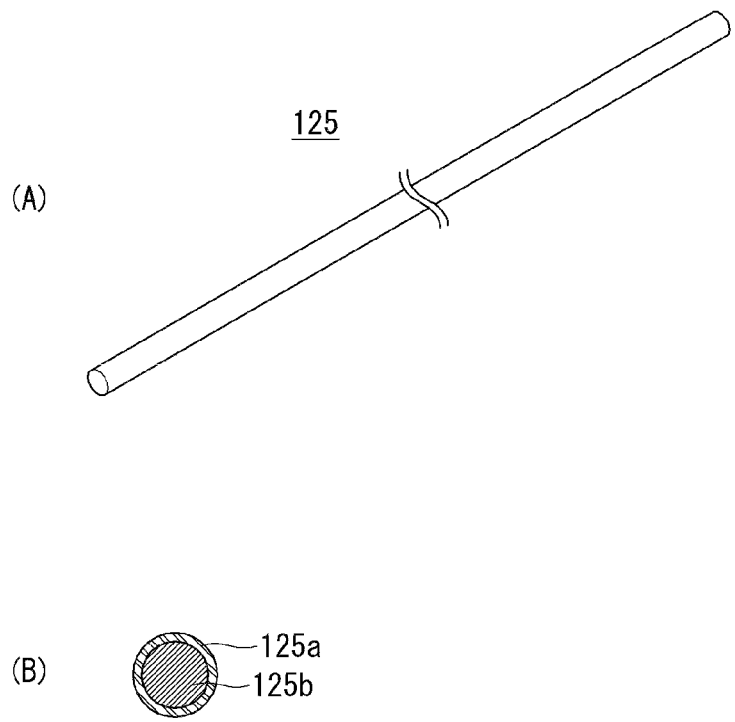
FIG. 4 shows a wiring member.

Hereinafter, a solar cell module according to an example embodiment of the invention is described with reference to FIGS. 1 to 4. FIG. 1 shows an entire shape of a solar cell module according to an example embodiment of the invention. FIG. 2 is a cross-sectional view taken along line A-A of FIG. 1. FIG. 3 is a cross-sectional view taken along line B-B of FIG. 1. FIG. 4 shows a wiring member.

As shown in FIGS. 1 to 4, the solar cell module according to the embodiment of the invention includes a plurality of solar cells C1 to C3 which are positioned adjacent to one another and are connected to one another using a plurality of wiring members 125 each having a thin line width. The wiring members 125 are physically and electrically connected to front electrodes 113 formed on a front surface of one of two adjacent solar cells and are physically and electrically connected to back electrodes 115 formed on a back surface of the other solar cell. Thus, the wiring members 125 are connected to the front electrodes 113 and the back electrodes 115 of the two adjacent solar cells, thereby electrically connecting the two adjacent solar cells.

The solar cell according to the embodiment of the invention is a bifacial solar cell, in which both a front surface and a back surface of a semiconductor substrate 111 receive light. In the bifacial solar cell according to the embodiment of the invention, the front electrodes 113 and the back electrodes 115 are arranged in the same form. The following embodiments are merely an example, and the embodiment of the invention is not limited thereto. Thus, the embodiment of the invention may be equally implemented in solar cells having all of known structures as long as there are no restrictions.

The solar cell has a thin polyhedral shape. The size of the polyhedral solar cell is approximately 156 mm long and 156 mm wide, and a thickness of the polyhedral solar cell is 150 µm to 250 µm.

The front electrodes 113 are formed on the front surface of the semiconductor substrate 111, on which light is incident, and are connected to the wiring members 125. The front electrodes 113 collect carriers of a conductive type opposite a conductive type of the semiconductor substrate 111. For example, if the semiconductor substrate 111 is a p-type semiconductor substrate, the front electrodes 113 may collect electrons.

The semiconductor substrate 111 forms a p-n junction and is an n-type or p-type semiconductor substrate containing impurities of a first conductive type.

The back electrodes 115 are formed on the back surface of the semiconductor substrate 111 in the form similar to the front electrode 113. The back electrodes 115 collect carriers of a conductive type opposite a conductive type of the front electrode 113.

An emitter region and a back surface field region, each of which is a heavily doped region, and a passivation layer, which prevents or reduces a recombination of carriers at the surface of the semiconductor substrate 111, exist between the semiconductor substrate 111 and the front electrodes 113 and between the semiconductor substrate 111 and the back electrodes 115.

The two adjacent solar cells each having the above configuration are connected to each other using the wiring members 125. The wiring members 125 are electrically connected to the front electrodes 113 and the back electrodes 115 formed on the front surfaces and the back surfaces of the two adjacent solar cells.

In the embodiment of the invention, each of the solar cells C1 to C3 has a corner (or an edge) 111a which constitutes a part of a circle. For example, a pseudo type wafer has the corner 111a by reason of the manufacturing process of the pseudo type wafer. Thus, the solar cell manufactured using the pseudo type wafer has the corner 111a.

In the embodiment of the invention, the wiring members 125 include a pair of first wiring members 125a, which are positioned across the corner 111a depending on a position, and a plurality of second wiring members 125b positioned between the first wiring members 125a.

The first wiring members 125a connect the two adjacent solar cells and are positioned on the outermost side among the plurality of wiring members. The plurality of second wiring members 125b positioned between the first wiring members 125a connect the two adjacent solar cells while they do not cross the corner 111a. The first wiring members 125a are separated from the second wiring members 125b by a predetermined distance, and the second wiring members 125b are separated from one another by a predetermined distance. Hence, the first wiring members 125a and the second wiring members 125b form a stripe arrangement.

As shown in (A) of FIG. 4, the wiring member 125 has a wire shape. (B) of FIG. 4 shows a cross section of the wiring member 125.

As shown in FIG. 4, the wiring member 125 has a circular cross section shape, in which a coating layer 125a is coated on a core layer 125b with a thin thickness (for example, about 12 µm). The entire thickness of the wiring member 125 is 250 µm to 500 µm. Other shapes may be used. For example, the cross section of the wiring member 125 may have a rectangular ribbon shape. In this instance, a width of the wiring member 125 having the rectangular ribbon shape may be 0.5 mm to 2 mm.

The core layer 125b is formed of a metal with good conductivity, for example, Ni, Cu, Ag, and Al. The coating layer 125a is formed of Pb, Sn, or a metal material having a chemical formula indicated by SnIn, SnBi, SnPb, SnCuAg, SnCu, etc., and includes a solder. Hence, the wiring member 125 may be connected to the electrodes 113 and 115 through the soldering for melting and combining a basic material.

When the two adjacent solar cells are connected to each other using the wiring members 125, the 10 to 18 wiring members 125 may be used when the size of the semiconductor substrate is 156 mm long and 156 mm wide. The number of wiring members 125 may vary depending on the size of the semiconductor substrate, a line width, a thickness, a pitch of the electrodes, etc.

So far, the embodiment of the invention described the wiring member 125 of the wire shape having the circular cross section. However, the cross section of the wiring member 125 may have various shapes including a rectangle, an oval, etc.

The wiring members 125 electrically connect the two adjacent first and second solar cells C1 and C2 by connecting one side of each wiring member 125 to the front electrodes 113 of the first solar cell C1 and connecting the other side of each wiring member 125 to the back electrodes 115 of the second solar cell C2. Further, the wiring members 125 electrically connect the two adjacent second and third solar cells C2 and C3 by connecting one side of each wiring member 125 to the front electrodes 113 of the second solar cell C2 and connecting the other side of each wiring member 125 to the back electrodes 115 of the third solar cell C3. Hence, the first to third solar cells C1 to C3 are electrically connected by the wiring members 125. In this instance, the wiring members 125 are positioned on the front surface and the back surface of each solar cell.

A preferable method for connecting the electrode to the wiring member is the soldering for melting and combining the basic material, but such a method is not required.

In the embodiment of the invention, a pad 140 may be selectively formed at a crossing of the front electrode 113 and the wiring member 125. The pad 140 increases an area of the crossing of the front electrode 113 and the wiring member 125 and reduces a contact resistance when the front electrode 113 is connected to the wiring member 125. Further, the pad 140 increases a connection strength between the front electrode 113 and the wiring member 125 and makes it easy for carriers to move from the front electrode 113 to the wiring member 125.

When the front electrode 113 and the wiring member 125 are soldered, the coating layer 125a of the wiring member 125 is heated for several seconds at a temperature equal to or higher than a melting temperature in a state where the wiring member 125 is positioned on each of the front surfaces and the back surfaces of the two adjacent solar cells and is positioned opposite the front electrode 113 and the back electrode 115. Hence, while the coating layer 125a is melted and cooled, the wiring member 125 is attached to the electrodes 113 and 115.

In the embodiment of the invention, the wiring member 125 is soldered through the front electrode 113 and the pad 140 and is melted and directly connected to the front electrode 113 at the crossing (not having the pad 140) of the front electrode 113 and the wiring member 125. Therefore, the efficiency of the solar cell may increase through a reduction in the contact resistance between the electrode and the wiring member, and also a connection strength of the wiring member may increase.

In an alternative example, the wiring member 125 may be attached to the electrode using a conductive adhesive. The conductive adhesive is a material obtained by adding conductive particles formed of Ni, Al, Ag, Cu, Pb, Sn, SnIn, SnBi, SnPb, SnCuAg, and SnCu or the solder to an epoxy-based synthetic resin or a silicon-based synthetic resin. The conductive adhesive is a material cured when heat is applied to the conductive adhesive of a liquid state. Further, the wiring member 125 of a solder paste may be attached to the electrode using a solder paste. The solder paste is a paste including solder particles, such as Pb or Sn, and melts and combines two basic materials while melting the solder particles existing in the solder paste when heat equal to or higher than a melting temperature is applied.

In the embodiment of the invention, the front electrode 113 does not include a bus electrode having a wide line width as in a related art. Instead, as described above, the front electrode 113 is directly connected to the wiring member 125. Thus, because the bus electrode is omitted, the manufacturing cost may be reduced. Further, because the bus electrode widely formed on the light receiving surface is omitted, the light receiving efficiency may increase, and the efficiency of the solar cell may increase.

Because the solar cell according to the embodiment of the invention is the bifacial solar cell, the configuration of the front electrode is substantially the same as the configuration of the back electrode, except a pitch between the electrodes. Thus, the description of the back electrode is omitted and is replaced by the description of the front electrode.

Figure 5:
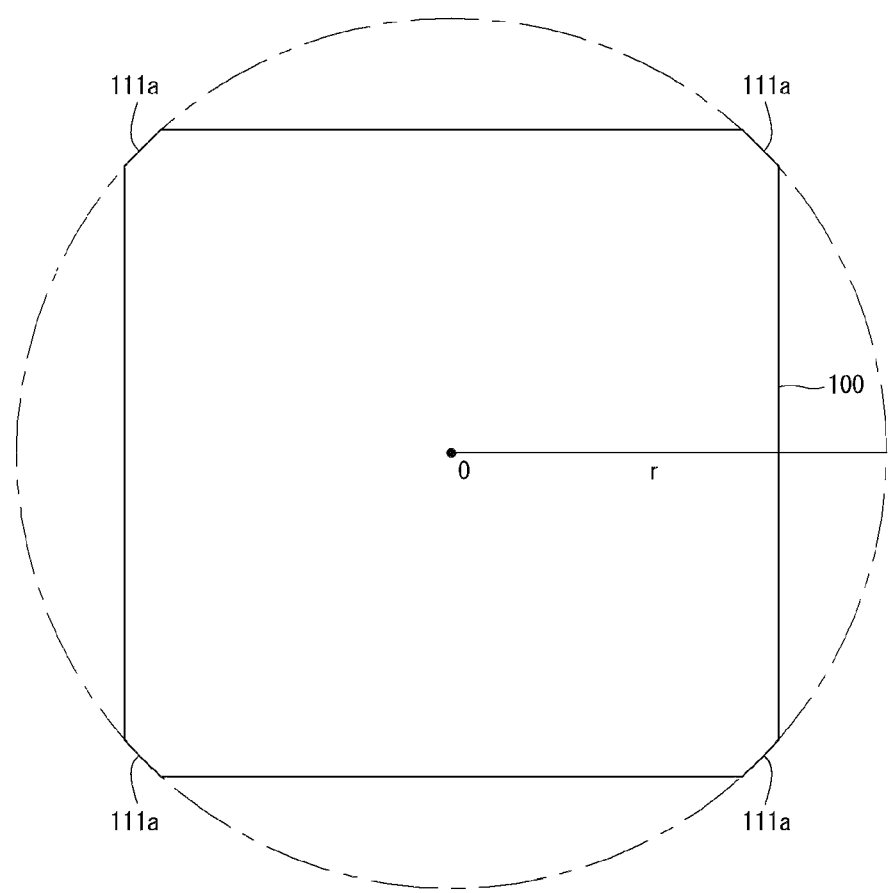
FIG. 5 illustrates a corner of a solar cell.

A corner 111a of a solar cell 100 constituting the solar cell module according to the embodiment of the invention is described in detail below with reference to FIGS. 5 and 6. FIG. 5 illustrates the corner of the solar cell, and FIG. 6 is an enlarged view of the corner.

Figure 6:
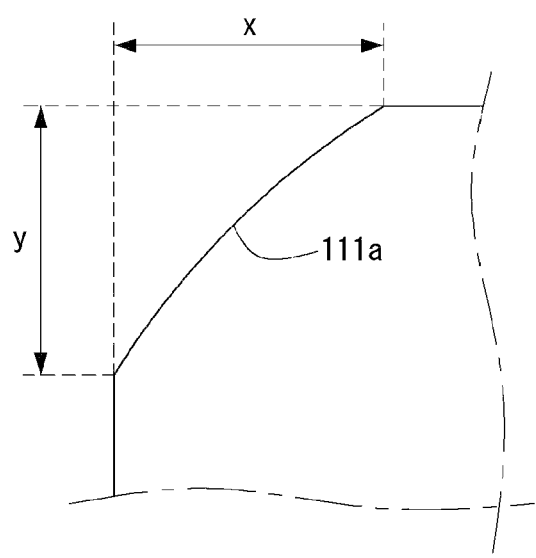
FIG. 6 is an enlarged view of a corner of a solar cell.

As shown in FIGS. 5 and 6, the solar cell 100 has an approximate square plane shape having the same length and width. The size of the most widely used semiconductor substrate in the current market is 156 mm long and 156 mm wide. Therefore, the embodiment of the invention is described based on the 156 mm by 156 mm semiconductor substrate, but any size semiconductor substrate may be used.

In the 156 mm by 156 mm solar cell, each corner 111a forms a part of a circle having a radius r of 100 mm to 104 mm. In this instance, a horizontal length x of the corner 111a is about 11 mm to 13 mm, and a vertical length y of the corner 111a is about 11 mm to 13 mm.

Thus, a vertical length y of the semiconductor substrate 111 at the corner 111a may be less than an entire vertical length (=156 mm) of the semiconductor substrate 111 by 22 mm to 26 mm. Accordingly, each of the corners 111a may have a curvature or a curved edge, but such is not required so that each of the corner 111a may have a straight edge. Additionally, based on the shape of the corners 111a, the semiconductor substrate 111 may be polygonal in shape, for example, octagonal.

Figure 7:
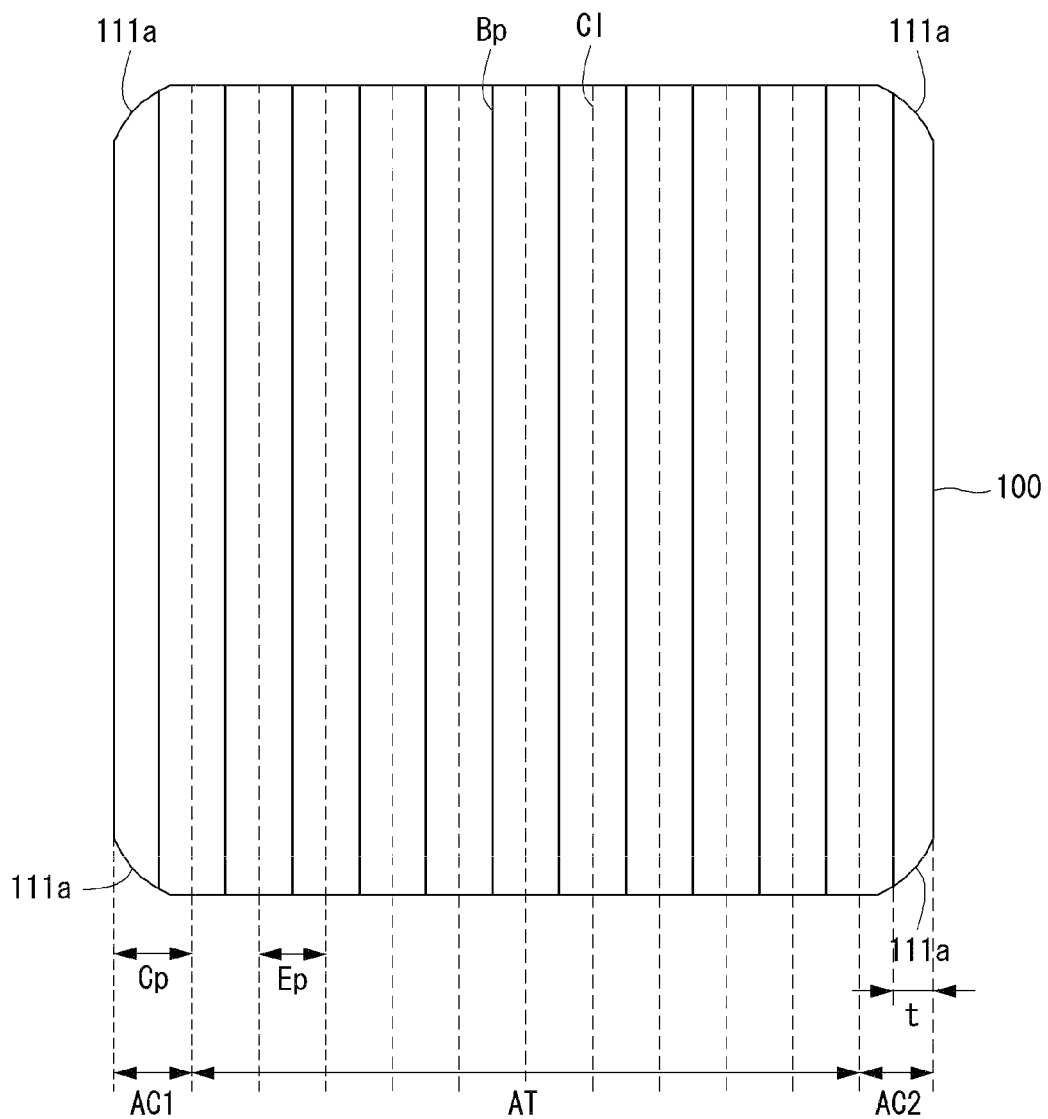
FIG. 7 illustrates a position of a wiring member in a solar cell.

When the adjacent solar cells are connected using the plurality of wiring members 125 as in the embodiment of the invention, the wiring members 125 may have an arrangement structure shown in FIG. 7, so as to efficiently collect and transfer carriers produced in the solar cell.

FIG. 7 shows an example of connecting the adjacent solar cells using the 12 wiring members.

As shown in FIG. 7, because it is preferable, but not required, that the plurality of wiring members uniformly collect and transfer carriers produced in the solar cell 100, the plurality of wiring members have to be entirely evenly positioned on the solar cell 100. Thus, when the horizontal length of the solar cell 100 is divided into 12 parts, the wiring member is positioned in the middle of each part.

In FIG. 7, "C1" is a division line for dividing the solar cell 100 into the 12 parts, and "Bp" is a middle line of each part. The wiring member is positioned on the middle line Bp and electrically connects the two adjacent solar cells.

In FIG. 7, because a distance Ep between the division lines C1 is 'horizontal length of the solar cell)/12', the distance Ep is 13 mm. Further, the horizontal length of the corner 111a is 11 mm to 13 mm and is greater than Ep/2. Thus, the first wiring member 125a positioned on the outermost side among the plurality of wiring members disposed on the solar cell is positioned across the corner 111a.

In other word, when the following equation 1 is satisfied, the first wiring member 125a is positioned across the corner 111a.

Horizontal length of corner (Cp)>(width of solar cell/number of wiring members)/2  [Equation 1]

When the solar cell 100 is divided into 12 parts and the wiring member is positioned in the middle of each part, a distance "t" from an end of the solar cell 100 to the wiring member is (the horizontal length of the solar cell/the number of wiring members)/2.

As described above, the vertical length y of the solar cell at the corner 111a may be less than the entire vertical length (=156 mm) of the solar cell by 22 mm to 26 mm. Thus, if a length of the wiring member disposed in corner areas AC1 and AC2 having the corner 111a is equal to a length of the wiring member disposed in a non-corner area AT not having the corner 111a, the wiring member disposed in the corner areas AC1 and AC2 may be exposed to the outside of the solar cell 100 due to the corner 111a.

Figure 8:
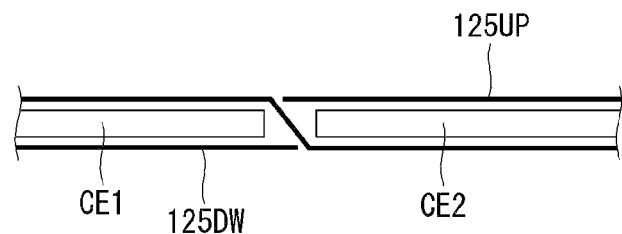
FIG. 8 illustrates the problem of a short circuit between wiring members in a solar cell.

However, as shown in FIG. 8, the wiring member is connected to front electrodes and back electrodes of two adjacent solar cells CE1 and CE2. Further, the wiring member is positioned on each of a front surface and a back surface of one solar cell. Wiring members 125UP and 125DW positioned on the front surface and the back surface of the solar cell are positioned on the same line. Thus, when the wiring member is exposed at the corner 111a, the problem of short circuit between the exposed wiring member and another wiring member positioned opposite the exposed wiring member on the same line is generated.

The embodiment of the invention solves the above problem by wiring the wiring member to the solar cell in consideration of the problem.

Figure 9:
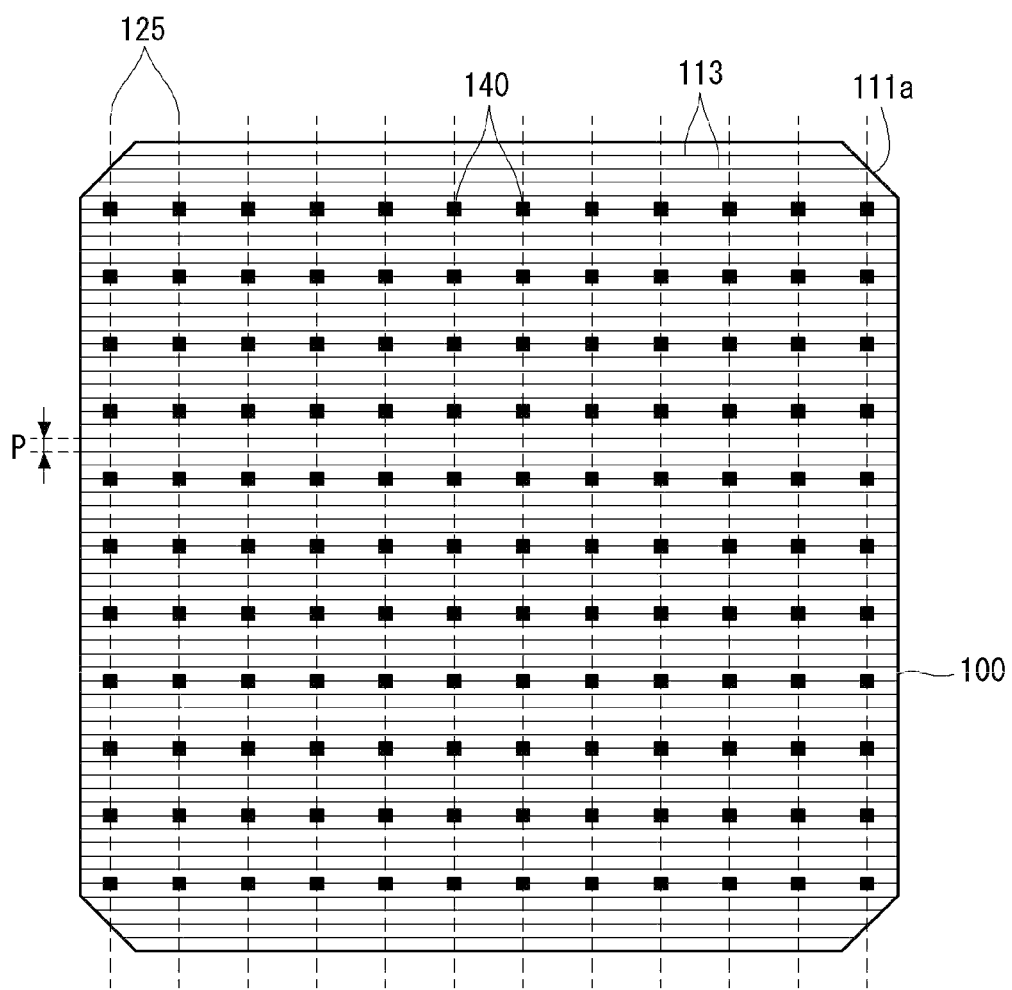
FIG. 9 is a plane view of a solar cell according to a first embodiment of the invention.
Figure 10:
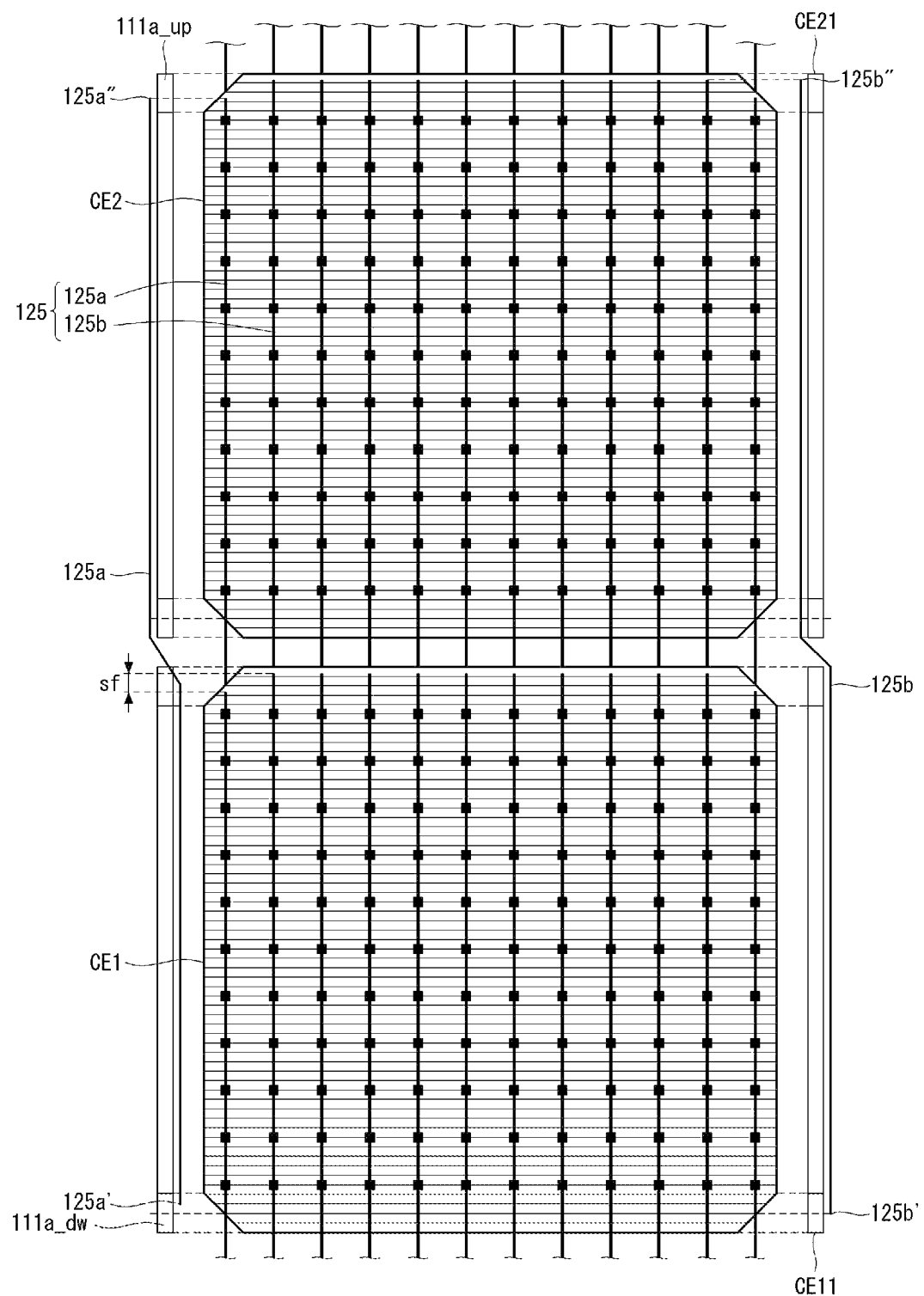
FIG. 10 is a plane view, in which a solar cell shown in FIG. 9 is connected to a wiring member.

FIG. 9 is a plane view of a solar cell according to a first embodiment of the invention, and FIG. 10 is a plane view, in which the solar cell shown in FIG. 9 is connected to a wiring member.

In FIGS. 9 and 10, front electrodes 113 are formed on a front surface of a solar cell 100.

Each front electrode 113 has a thin line width and extends in one direction. Thus, the front electrodes 113 are arranged in parallel with one another and form a stripe arrangement. The front electrode 113 has the line width of 40 μm to 100 μm and a thickness of 15 μm to 30 μm. A pitch P between the front electrodes 113 is 1.3 mm to 1.9 mm.

In the embodiment of the invention, the front electrode 113 has the thin line width, but does not include a bus electrode included in the related art. Thus, when the front electrode 113 is connected to a wiring member 125, a contact area between the front electrode 113 and the wiring member 125 is small. Thus, it is difficult to transfer carriers, and also it is difficult to electrically and physically connect the front electrode 113 to the wiring member 125.

The front electrode 113 includes a pad 140 in consideration of the difficulty.

The pad 140 is disposed at a crossing of the front electrode 113 and the wiring member 125. It is preferable, but not required, that the pad 140 is formed every n lines in a longitudinal direction of the wiring member 125, where n is a natural number. FIGS. 9 and 10 show an example where the pad 140 is formed every five lines.

The number of pads 140 is determined depending on the size of the pad, the thickness of the electrode, the pitch, etc.

The pad 140 and the front electrode 113 may be simultaneously formed using a screen printing method at the same process stage, or may be individually formed through different processes.

The embodiment of the invention was described based on the front electrodes 113, but the back electrodes 115 have substantially the same configuration as the front electrodes 113 because the solar cell according to the embodiment of the invention is the bifacial solar cell. Therefore, the description of the back electrodes 115 is omitted.

The wiring member 125 connects the two adjacent solar cells CE1 and CE2 in a direction crossing the front electrode 113 thus formed.

In the embodiment of the invention, as described above with reference to FIG. 7, the wiring member 125 is positioned in the middle of each of the parts obtained by dividing the width of the solar cell into the total number of wiring members. Further, the wiring member 125 is positioned in each of the corner areas AC1 and AC2 and the non-corner area AT.

More specifically, the non-corner area AT of the solar cell may be positioned in the middle of the semiconductor substrate, and the corner areas AC1 and AC2 of the solar cell may be positioned on the both sides of the non-corner area AT in the semiconductor substrate. A length of each of the corner areas AC1 and AC2 may be shorter than a length of the non-corner area AT.

In this instance, the wiring member connected to the first electrode 113 and the wiring member connected to the second electrode 115 may be positioned in the corner areas AC1 and AC2.

In such a condition, a total of 12 wiring members 125 are positioned. In this instance, first wiring members 125a are positioned in the corner areas AC1 and AC2, and second wiring members 125b are positioned in the non-corner area AT. More specifically, the two first wiring members 125a are respectively positioned in the corner areas AC1 and AC2, and the ten second wiring members 125b are positioned in the non-corner area AT. The wiring members 125 are separated from one another by a uniform distance and extend in parallel with one another, thereby forming a string arrangement.

The first wiring members 125a connect the two adjacent solar cells CE1 and CE2 in the corner areas AC1 and AC2 each having the corner 111a, and the second wiring members 125b connect the two adjacent solar cells CE1 and CE2 in the non-corner area AT not having the corner 111a.

One side of the first wiring member 125a is positioned on a front surface of the first solar cell CE1 and is connected to the front electrode 113 of the first solar cell CE1. The other side of the first wiring member 125a is positioned on a back surface of the second solar cell CE2 and is connected to the back electrode 115 of the second solar cell CE2. Further, one end 125a' of the first wiring member 125a is adjacent to a lower corner 111a_dw at a back surface of the first solar cell CE1, and the other end 125a" of the first wiring member 125a is adjacent to an upper corner 111a up at a front surface of the second solar cell CE2. Hence, the first wiring member 125a connects the two adjacent solar cells CE1 and CE2.

In the same manner as the first wiring member 125a, one side of the second wiring member 125b is positioned on the front surface of the first solar cell CE1 and is connected to the front electrode 113 of the first solar cell CE1. The other side of the second wiring member 125b is positioned on the back surface of the second solar cell CE2 and is connected to the back electrode 115 of the second solar cell CE2. Further, the second wiring member 125b connects the two adjacent solar cells CE1 and CE2 in a state where one end 125b' of the second wiring member 125b is adjacent to a lower end CE11 of the first solar cell CE1 and the other end 125b" of the second wiring member 125b is adjacent to an upper end CE21 of the second solar cell CE2. Thus, in the embodiment of the invention, the total length of the first wiring member 125a is shorter than the total length of the second wiring member 125b due to the corner 111. The end of the second wiring member 125b and end of the second wiring member 125b are shifted by a distance "sf". The shift distance "sf" is less than a width (i.e., a length in the longitudinal direction of the wiring member) of the corner 111a.

As described above, because the total length of the first wiring member 125a is shorter than the total length of the second wiring member 125b, the total number of front electrodes and back electrodes connected to the first wiring member 125a are less than the total number of front electrodes and back electrodes connected to the second wiring member 125b.

Figure 11:
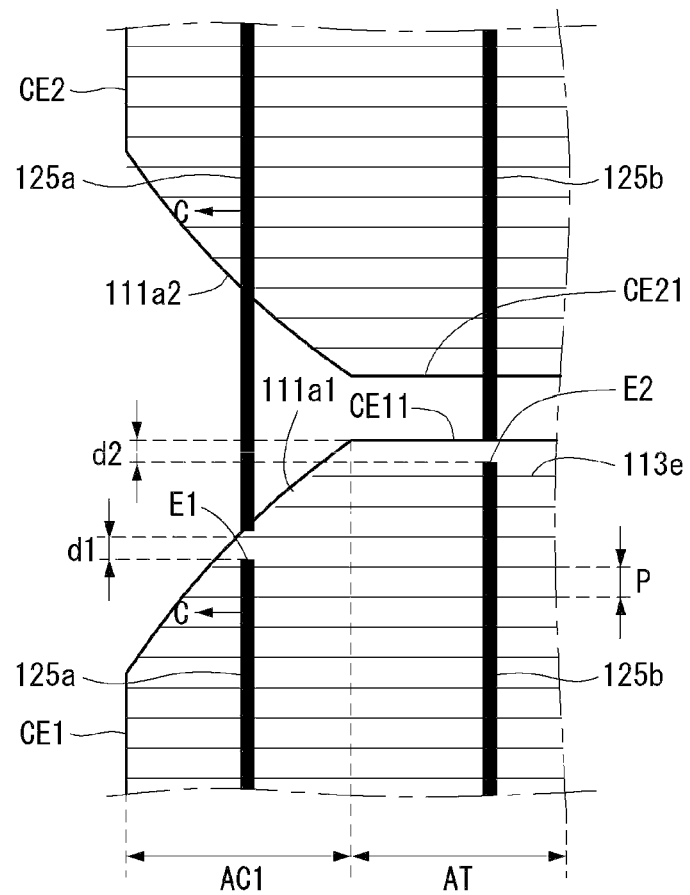
FIG. 11 is an enlarged view of a corner in two adjacent solar cells.
Figure 12:
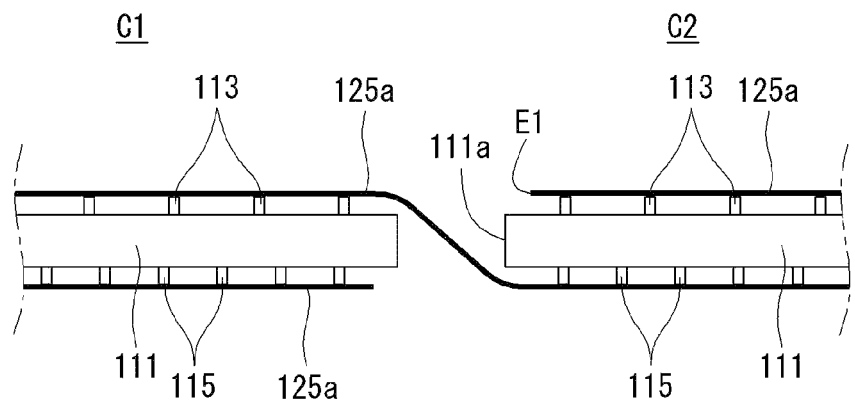
FIG. 12 is a cross-sectional view taken along line C-C of FIG. 11.

The wiring member disposed at the corner is described in detail below with reference to FIGS. 11 and 12. FIG. 11 is an enlarged view of a corner in two adjacent solar cells, and FIG. 12 is a cross-sectional view taken along line C-C of FIG. 11.

As shown in FIG. 11, an end E1 of the first wiring member 125a positioned on the first solar cell CE1 is separated from a corner 111a1 by a first distance d1, and an end E2 of the second wiring member 125b positioned on the first solar cell CE1 is separated from the end CE11 of the first solar cell CE1 by a second distance d2.

It is preferable, but not required, that the end E2 of the second wiring member 125b in the non-corner area AT is positioned between the end CE11 of the first solar cell CE1 and a front electrode 113e next to the end CE11.

If the end E2 of the second wiring member 125b is positioned ahead of the end CE11 of the first solar cell CE1 and is positioned between the two solar cells CE1 and CE2, the arrangement shown in FIG. 8 may be formed. Hence, the short circuit between the second wiring members, which are positioned opposite each other with the solar cell interposed therebetween, may be generated. Further, if the end E2 of the second wiring member 125b is positioned behind of the last front electrode 113e, the last front electrode 113e may not be connected to the second wiring member 125b. Therefore, carriers collected by the last front electrode 113e may not be transferred to the second wiring member 125b, and thus the efficiency of the solar cell may be reduced.

Because the first wiring member 125a is separated from the corner 111a1 by the first distance d1 in the same manner as the second wiring member 125b, the short circuit between the first wiring members, which are positioned opposite each other with the solar cell interposed therebetween, may be prevented.

As described above, in the embodiment of the invention, because the first wiring member 125a is separated from the corner 111a1 by the first distance d1, the short circuit of the first wiring member 125a positioned on the upper side and the lower side of the solar cell may be prevented due to the corner 111a1.

However, when the first wiring member 125a is separated from the corner 111a1 by the first distance d1 as described above, the first wiring member 125a is not electrically connected to the front electrodes existing between the end E1 of the first wiring member 125a and the end CE11 of the first solar cell CE1 because of the corner 111a1. Hence, it may be difficult to collect carriers. However, in the embodiment of the invention, because the second wiring member 125b next to the first wiring member 125a is connected to all of the front electrodes 113, the difficulty in collecting the carriers may be solved.

In the embodiment of the invention, the first wiring member 125a is separated from the corner 111a1 by the first distance d1, and the second wiring member 125b is separated from the end CE11 of the first solar cell CE1 by the second distance d2. Thus, the end E1 of the first wiring member 125a and the end E2 of the second wiring member 125b are not positioned on the same line.

It is preferable, but not required, that the first distance d1 is equal to the second distance d2. Further, it is preferable, but not required, that the second distance d2 is less than the pitch P between the front electrodes 113. If the second distance d2 is greater than the pitch p, the second wiring member 125b may not be electrically connected to the last front electrode 113e.

It is preferable, but not required, that the first distance d1 is less than the pitch P between the front electrodes 113 in the same manner as the second distance d2. In this instance, the first wiring member 125a may be electrically connected to as many front electrodes 113 as possible.

The first wiring member 125a is positioned in the corner area AC1. Thus, the number of front electrodes 113 connected to the first wiring member 125a is less than the number of front electrodes 113 connected to the second wiring member 125b.

Figure 13:
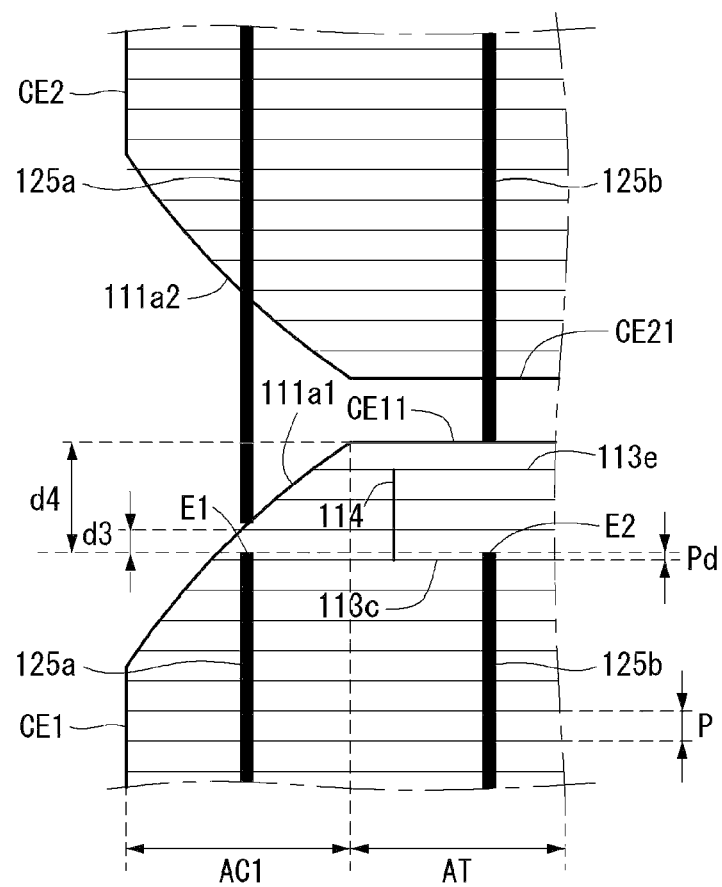
FIG. 13 shows an example where an end of a first wiring member and an end of a second wiring member are positioned on the same line.

FIG. 13 shows an example where the end E1 of the first wiring member 125a and the end E2 of the second wiring member 125b are positioned on the same line. As shown in FIG. 13, when the end E1 of the first wiring member 125a and the end E2 of the second wiring member 125b are positioned on the same line, the manufacturing process may be simplified. When the end E1 of the first wiring member 125a and the end E2 of the second wiring member 125b are not positioned on the same line, the first wiring member 125a and the second wiring member 125b have to be individually cut. However, when the end E1 of the first wiring member 125a and the end E2 of the second wiring member 125b are positioned on the same line as described above, the first wiring member 125a and the second wiring member 125b may be simultaneously cut.

As shown in FIG. 13, because the end E1 of the first wiring member 125a and the end E2 of the second wiring member 125b are positioned on the same line, a distance Pd protruding from a fourth front electrode 113c to the end E1 of the first wiring member 125a is equal to a distance Pd protruding from the fourth front electrode 113c to the end E2 of the second wiring member 125b.

The end E1 of the first wiring member 125a is separated from the corner 111a1 by a third distance d3, and the end E2 of the second wiring member 125b is separated from the end CE11 of the first solar cell CE1 by a fourth distance d4. The end E1 of the first wiring member 125a and the end E2 of the second wiring member 125b are positioned on the same line, but the third distance d3 is shorter than the fourth distance d4 due to the corner 111a1.

When the end E2 of the second wiring member 125b is positioned on the same line as the end E1 of the first wiring member 125a as in the embodiment of the invention, the front electrodes, which are not connected to the second wiring member 125b, exist. If the front electrodes are not connected to the wiring member, carriers collected by the front electrodes may not be transferred to the wiring member. Hence, the efficiency of the solar cell may be reduced.

The embodiment of the invention solves the above problem by connecting the electrode, which is not connected to the second wiring member 125b because of the shift of the second wiring member 125b, to another electrode connected to the wiring member.

The solar cell module according to the embodiment of the invention includes a connection bar 114 for electrically connecting the last front electrode 113e to the fourth front electrode 113c.

The connection bar 114 electrically connects the front electrodes existing between the last front electrode 113e, which is not connected to the second wiring member 125b, and the fourth front electrode 113c. Further, because the fourth front electrode 113c is connected to the second wiring member 125b, the front electrodes, which are not directly connected to the second wiring member 125b, are connected to the second wiring member 125b.

In the embodiment of the invention, the connection bar 114 may be configured as a part of the front electrode 113, or may be configured irrespective of the front electrode 113. In this instance, the connection bar 114 may be formed of the wiring member 125. Further, the connection bar 114 may be together formed when the wiring member 125 is soldered to the front electrode 113.

The number of connection bars 114 may increase or decrease depending on the number of electrodes, which are not connected to the wiring member. For example, as the number of electrodes, which are not connected to the wiring member, increases, the number of connection bars 114 increases.

Figure 14:
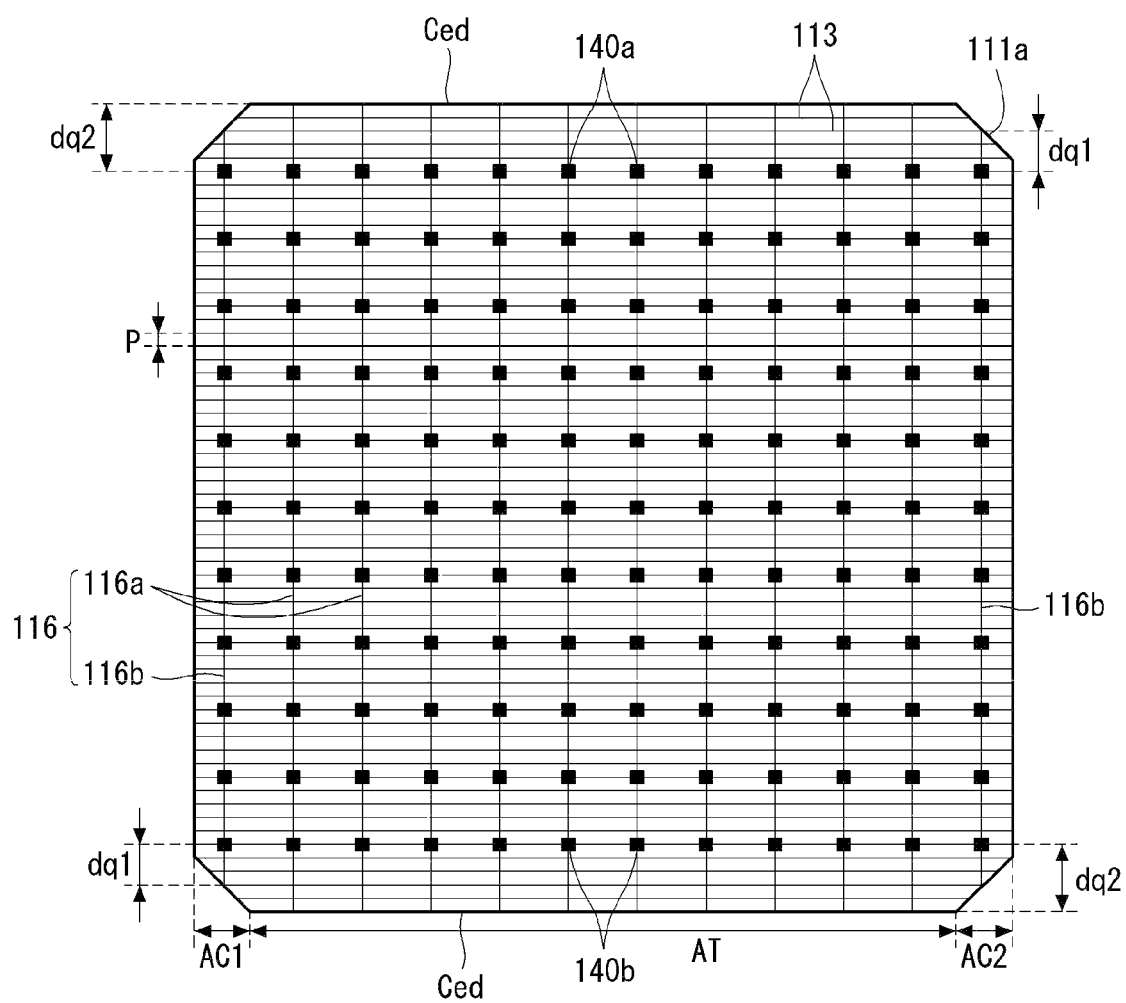
FIG. 14 is a plane view of a solar cell according to a second embodiment of the invention.
Figure 15:
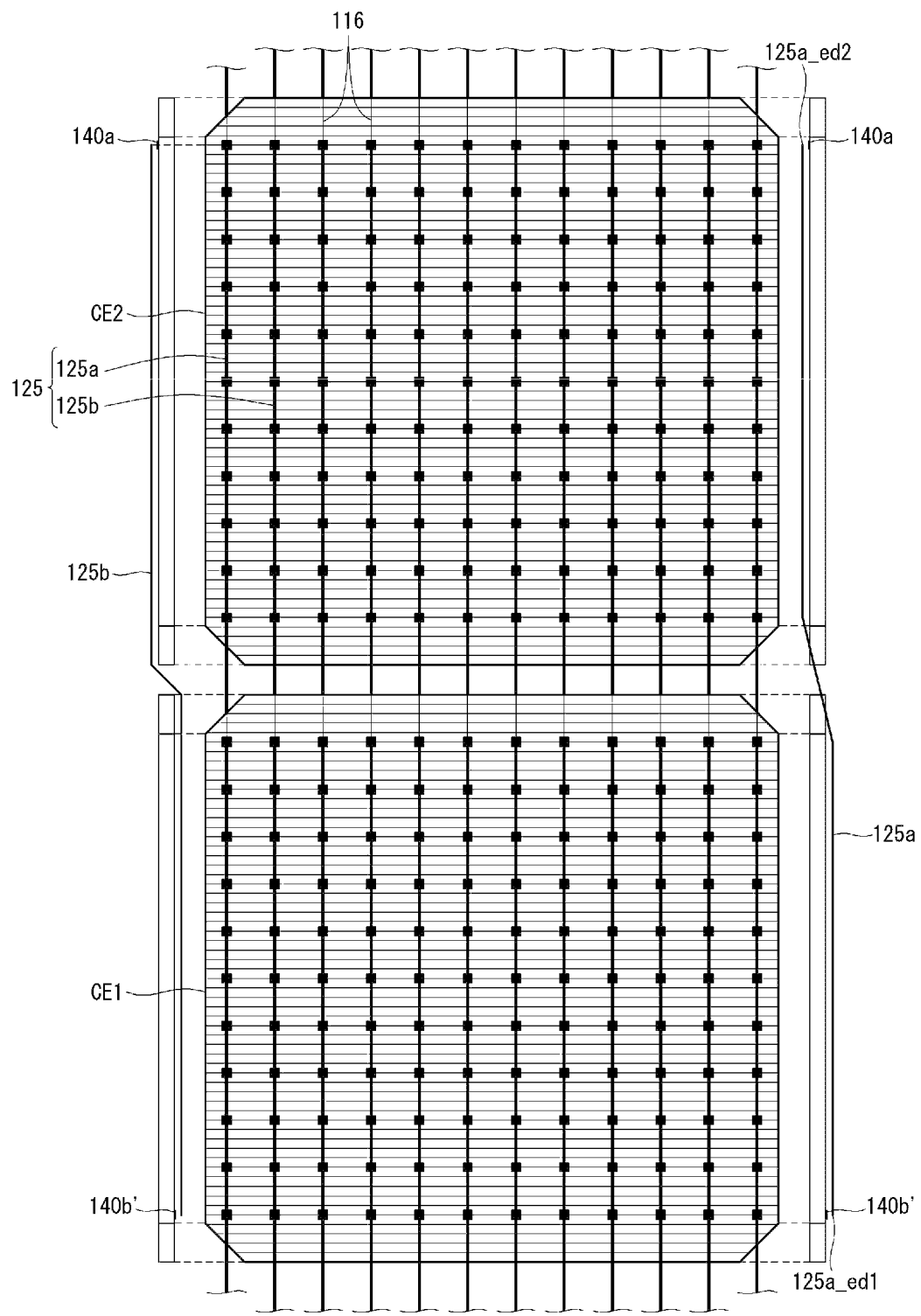
FIG. 15 is a plane view, in which a solar cell shown in FIG. 14 is connected to a wiring member.

FIG. 14 is a plane view of a solar cell according to a second embodiment of the invention. FIG. 15 is a plane view, in which a solar cell shown in FIG. 14 is connected to a wiring member.

As shown in FIGS. 14 and 15, front electrodes 113 and connection electrodes 116 are formed on a front surface of a solar cell 100.

In the same manner as the first embodiment of the invention, the front electrodes 113 each have a thin line width, extend in one direction, and are arranged in parallel with one another to form a stripe arrangement. The front electrode 113 has the line width of 40 μm to 100 μm and a thickness of 15 μm to 30 μm. A pitch P between the front electrodes 113 is 1.3 mm to 1.9 mm.

The connection electrodes 116 each have a thin line width in the same manner as the front electrodes 113, extend in a direction crossing the front electrodes 113, and electrically and physically connect the front electrodes 113.

In a preferable example, the connection electrode 116 has the line width of 40 μm to 100 μm and a thickness of 15 μm to 30 μm in the same manner as the front electrode 113.

The connection electrodes 116 are positioned at a position corresponding to a formation position of the wiring members and connect the front electrodes 113 crossing the wiring members. In the embodiment of the invention, one connection electrode 116 exists in each of corner areas AC1 and AC2, and the ten connection electrodes 116 exist in a non-corner area AT in the same manner as the wiring member.

A connection electrode 116b positioned in each corner area electrically and physically connects the front electrodes 113 existing in the corner areas AC1 and AC2, and connection electrodes 116a positioned in the non-corner area AT electrically and physically connect the front electrodes 113 existing in the non-corner area AT. Hence, the front electrodes 113 in the corner areas AC1 and AC2 and the non-corner area AT are connected by the connection electrodes 116.

In the embodiment of the invention, the connection electrodes 116 positioned at the position corresponding to the wiring member connect the front electrodes 113, thereby increasing a connection strength between the wiring members and the electrodes. Further, carriers collected by the front electrodes 113 can be sufficiently transferred to wiring members 125.

As an example, the wiring member 125 is fixed to a pad 140 through the soldering. Further, the wiring member 125 is positioned opposite the connection electrode 116 and is fixed to the connection electrode 116 through the soldering. Hence, the connection strength between the wiring member and the electrode increases.

In the embodiment of the invention, the pads 140 are formed at crossings of the front electrodes 113 and the connection electrodes 116.

The pad 140 increases an area of the crossing of the front electrode 113 and the wiring member 125 and reduces a contact resistance when the front electrode 113 is connected to the wiring member 125, thereby sufficiently transferring carriers collected by the front electrode 113 to the wiring member 125 and increasing the connection strength between the front electrode 113 and the wiring member 125.

It is preferable, but not required, that the pads 140 are respectively formed at all of the crossings of the front electrodes 113 and the connection electrodes 116 in a longitudinal direction of the wiring member. However, in this instance, a light receiving area decreases, and the manufacturing cost increases. Thus, in the embodiment of the invention, the pad 140 is formed, for example, every five lines in consideration of this. The number of pads 140 is determined depending on a collection efficiency of carriers, the size of the pad, the connection strength between the wiring member and the electrode, etc.

The pads 140 are connected to one another using the connection electrode 116.

First and second outermost pads 140a and 140b, which are positioned closest to both ends Ced of the solar cell along a longitudinal direction of the connection electrode 116, are separated from the ends Ced of the solar cell by a uniform distance.

The first and second outermost pads 140a and 140b disposed in the corner areas AC1 and AC2 are separated from the end of the solar cell by a first distance dq1 due to a corner 111a. Further, the first and second outermost pads 140a and 140b disposed in the non-corner area AT are separated from the end Ced of the solar cell by a second distance dq2 longer than the first distance dq1.

In the embodiment of the invention, as shown in FIGS. 14 and 15, it is preferable, but not required, that the outermost pads 140a and 140b are formed at the same position as the pads adjacent to the outermost pads.

Ends of all of the wiring members are fixed on the same line as the outermost pads 140a and 140b. If positions of the outermost pads 140a and 140b are different from each other, the wiring members 125 have to be differently cut when the wiring members are cut. However, when the wiring members 125 are disposed at the same position as in the embodiment of the invention, all of the wiring members 125 may be cut at a time. Hence, the manufacturing cost and time may be reduced.

The second embodiment of the invention was described based on the front electrodes 113 and the connection electrodes 116 formed on the front surface of the solar cell. However, because the solar cell according to the second embodiment of the invention is a bifacial solar cell, back electrodes 115 formed on a back surface of the solar cell are formed in the same manner as the front electrodes 113, and connection electrodes and pads on the back surface of the solar cell are formed in the same manner as the front surface of the solar cell. Therefore, a further description thereof may be briefly made or may be entirely omitted.

As shown in FIG. 15, first and second wiring members 125a and 125b are connected to the front electrodes and the back electrodes of the two adjacent solar cells, thereby electrically and physically connecting the two adjacent solar cells.

One end 125a_ed1 of the first wiring member 125a is connected to a second outermost pad 140b' formed on a back surface of a first solar cell CE1 on the same line as the second outermost pad 140b', and the other end 125a_ed2 of the first wiring member 125a is connected to a first outermost pad 140a formed on a front surface of a second solar cell CE2 on the same line as the first outermost pad 140a.

When the first wiring member 125a is connected to the outermost pads 140b' and 140a as described above, the front electrodes 113 existing between the outermost pads 140b' and 140a and the corner 111a are not connected to the first wiring member 125a. Hence, the efficiency of the solar cell may be reduced. However, in the embodiment of the invention, the front electrodes 113 existing between the outermost pads 140a and 140b and the end of the solar cell are connected to the outermost pads 140a and 140b through the connection electrode 116. A reduction in the efficiency of the solar cell may be prevented or reduced.

In the same manner as the first wiring member 125a, ends of the second wiring member 125b are connected to the outermost pads 140b' and 140a, and the connection electrode 116 connects the front electrodes 113 existing between the outermost pads 140b' and 140a and the end of the solar cell.

As described above, the ends of the first and second wiring members are connected to the outermost pads, and the first and second wiring members are separated from the corner and the end of the solar cell by the uniform distance and are fixed to the first and second solar cells CE1 and CE2. Thus, the short circuit generated by overlapping the two wiring members, which are positioned opposite each other with the solar cell interposed therebetween as shown in FIG. 8, may be prevented. Further, because the end of the writing member 125 is positioned on the same line as the pad 140 and is fixed to the pad 140, the end of the writing member may be strongly fixed. Hence, the problems generated at the end of the writing member may be solved.

Figure 16:
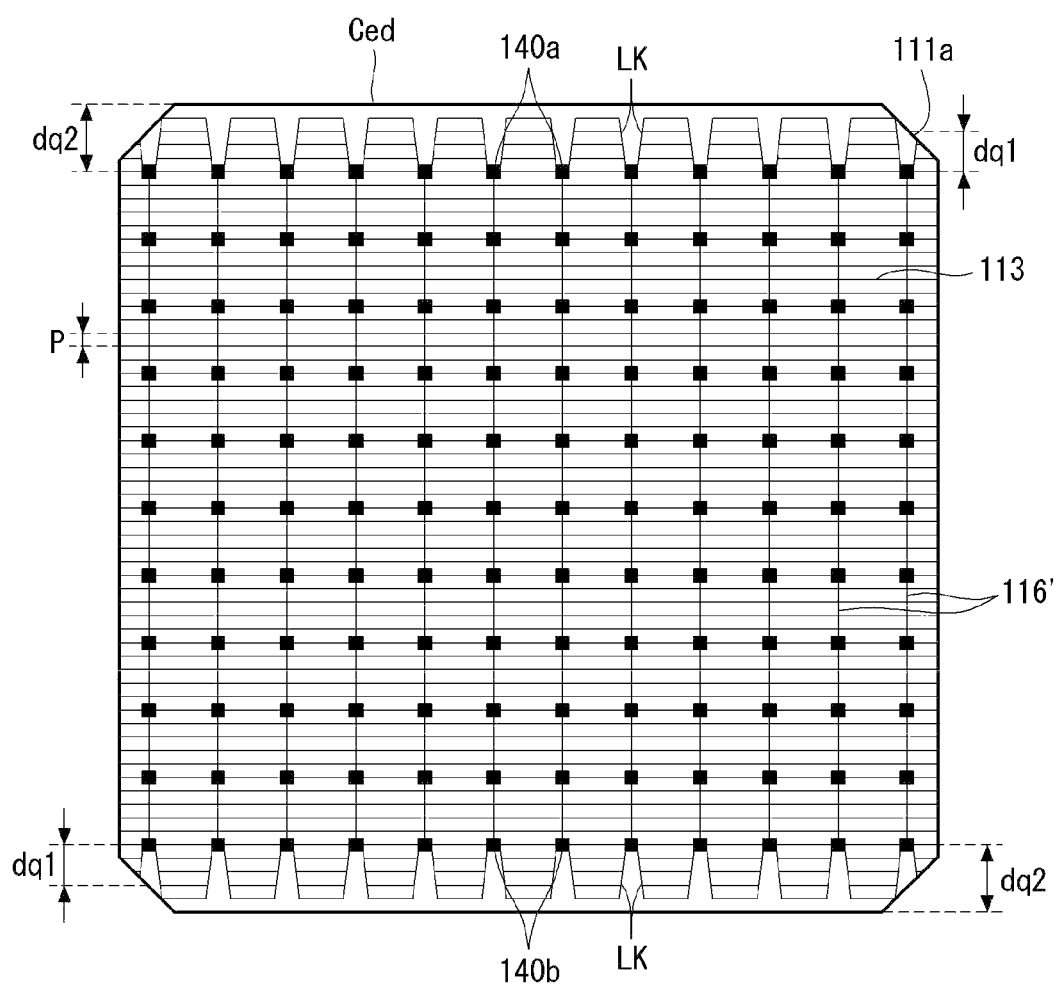
FIG. 16 is a plane view of a solar cell according to a third embodiment of the invention.
Figure 17:
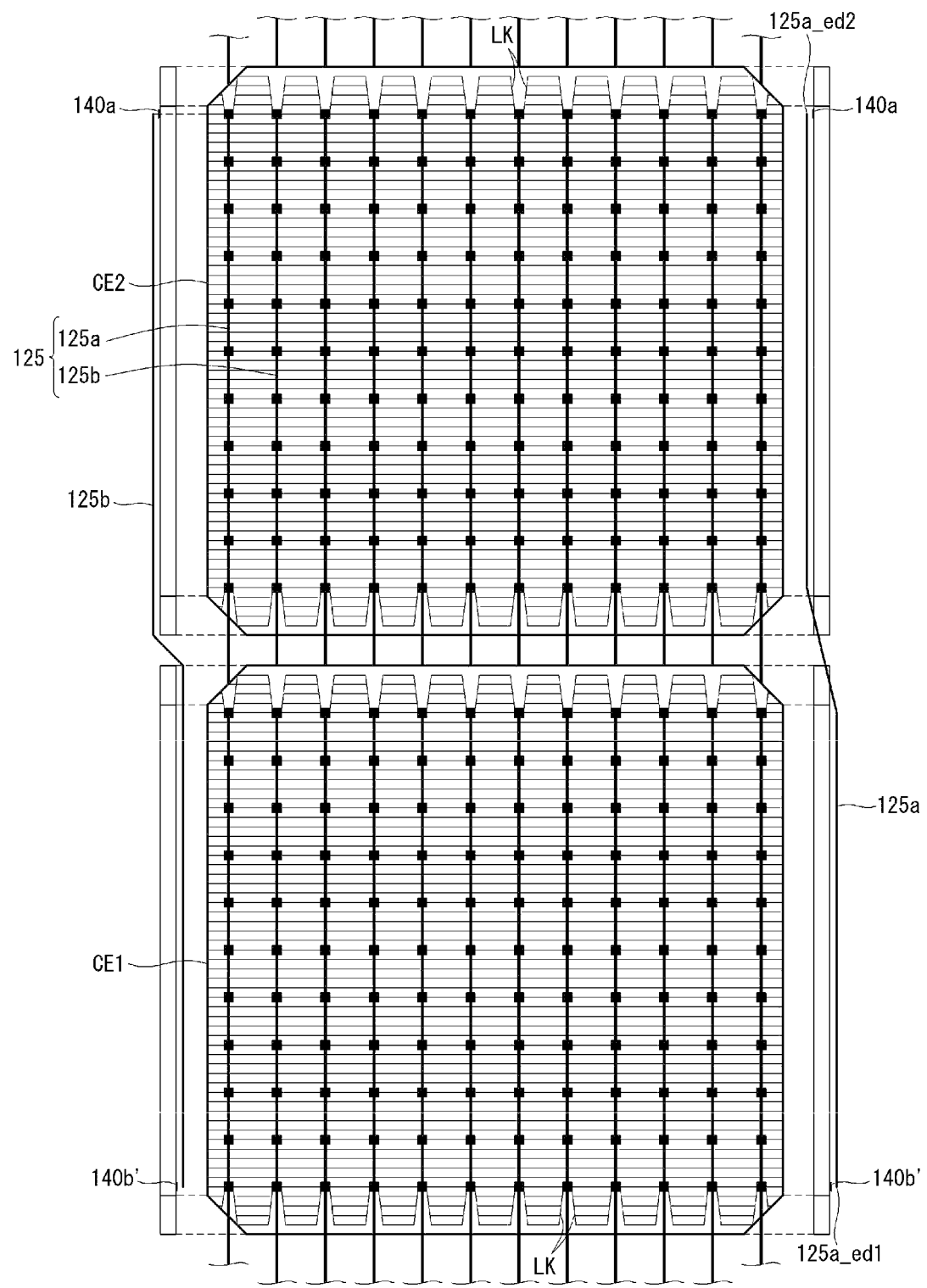
FIG. 17 is a plane view, in which a solar cell shown in FIG. 16 is connected to a wiring member.

FIG. 16 is a plane view of a solar cell according to a third embodiment of the invention. FIG. 17 is a plane view, in which a solar cell shown in FIG. 16 is connected to a wiring member.

The third embodiment of the invention shown in FIGS. 16 and 17 is substantially the same as the second embodiment of the invention, except that front electrodes existing between an end of the solar cell and first and second outermost pads are connected through link electrodes LK.

In the third embodiment of the invention, a connection electrode 116' is positioned between a first outermost pad 140a and a second outermost pad 140b and connects front electrodes 113 between the first and second outermost pads 140a and 140b.

Front electrodes 113 positioned between the first and second outermost pads 140a and 140b and an end of the solar cell are electrically and physically connected to the first and second outermost pads 140a and 140b through the link electrodes LK.

The link electrode LK extends in an oblique direction from the first and second outermost pads 140a and 140b toward an end Ced of the solar cell. A pair of link electrodes LK are arranged in a left-right symmetric manner based on the wiring member 125.

Because there is no front electrode between the link electrodes LK, the front electrode 113 has a V-shaped groove depressed from the first and second outermost pads 140a and 140b toward the end Ced of the solar cell.

In the third embodiment of the invention, the link electrode LK electrically and physically connects the front electrodes 113 existing between the first and second outermost pads 140a and 140b and the end of the solar cell. The link electrode LK is configured as a part of the front electrode 113.

Figure 18:
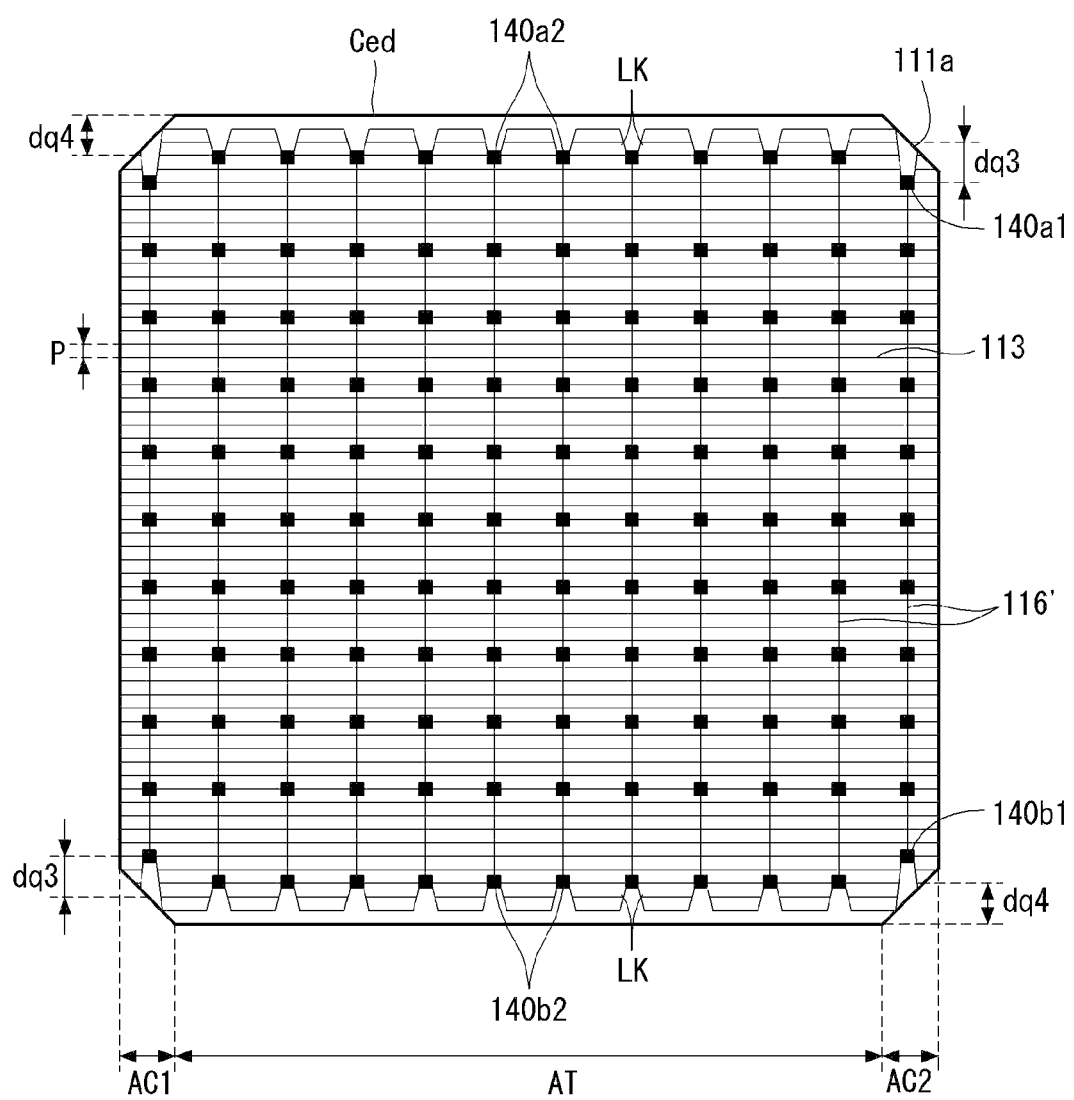
FIG. 18 is a plane view of a solar cell according to a fourth embodiment of the invention.
Figure 19:
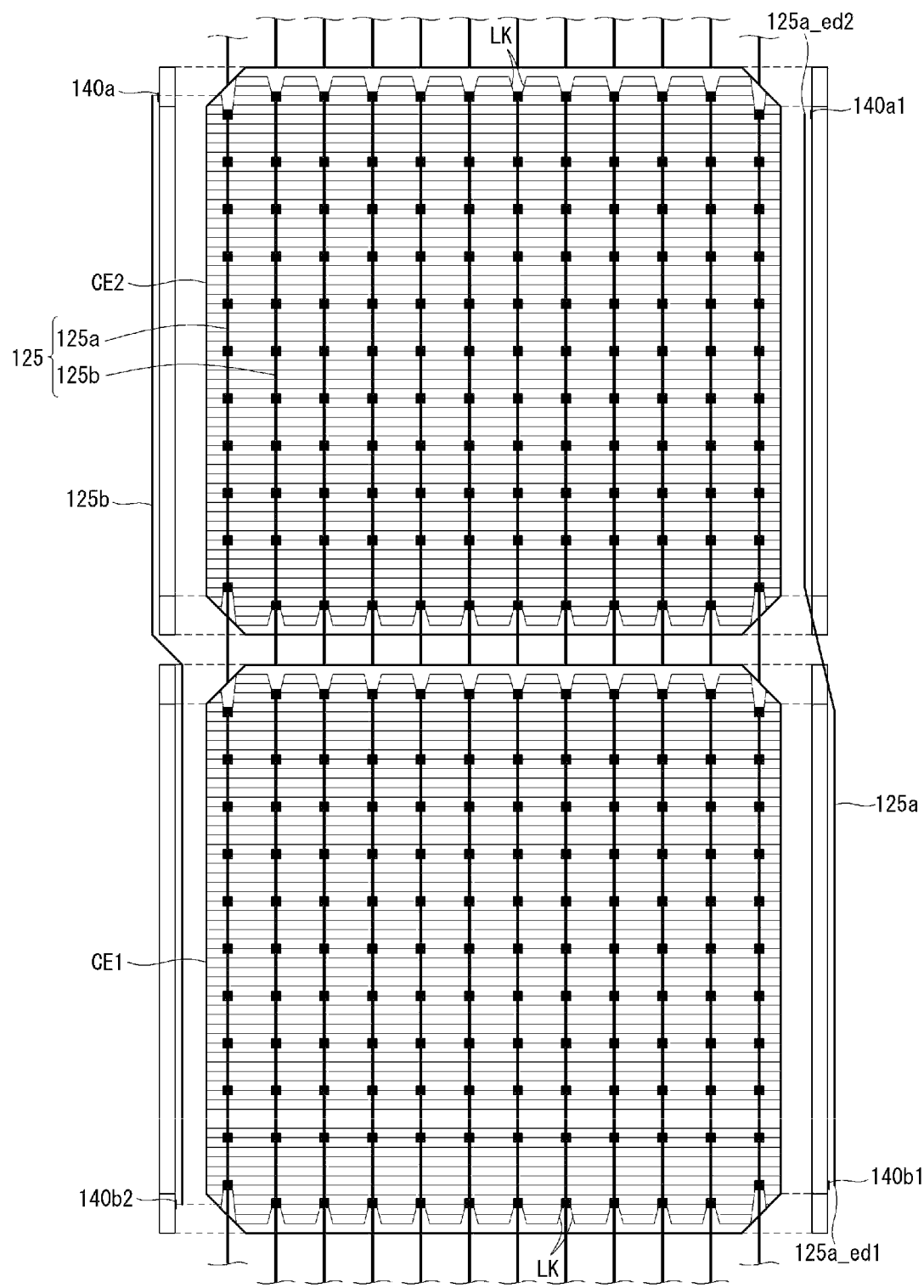
FIG. 19 is a plane view, in which a solar cell shown in FIG. 18 is connected to a wiring member.

FIG. 18 is a plane view of a solar cell according to a fourth embodiment of the invention. FIG. 19 is a plane view, in which a solar cell shown in FIG. 18 is connected to a wiring member.

The fourth embodiment of the invention shown in FIGS. 18 and 19 is substantially the same as the third embodiment of the invention, except a position of first and second outermost pads.

First and second outermost pads 140a1 and 140b1 disposed in corner areas AC1 and AC2 are separated from a corner 111a by a third distance dq3, and first and second outermost pads 140a2 and 140b2 disposed in a non-corner area AT are separated from an end of the solar cell by a fourth distance dq4.

Preferably, the third distance dq3 and the fourth distance dq4 are substantially the same as each other and are 5 mm to 15 mm.

In the fourth embodiment of the invention, the first and second outermost pads are separated from an end or a corner 111a of the solar cell by the same distance. Therefore, the first and second outermost pads according to the fourth embodiment of the invention are not positioned on the same line, unlike the third embodiment of the invention. Thus, because the end of the wiring member is positioned on the same line as the first and second outermost pads, a first wiring member 125a disposed in the corner areas AC1 and AC2 and a second wiring member 125b disposed in the non-corner area AT have to be dividedly cut. However, in this instance, a connection strength of the wiring member may increase.

When the wiring member connects the two adjacent solar cells, the wiring member has to be connected to each of the front surface and the back surface of the solar cell. Therefore, the wiring member cannot help being bent at an interface between the two solar cells. However, because the wiring member is formed of the metal material, a physical stress may be generated in the wiring member if the wiring member is bent. Further, because the wiring member is exposed at a high temperature in a module process, a thermal stress is generated in addition to the physical stress. Hence, the connection strength between the wiring member and the solar cell is reduced.

According to an experiment, when the wiring member was separated from the end of the solar cell by 5 mm to 15 mm and was attached to the outermost pad, the connection strength increased. Hence, in the embodiment of the invention, the connection strength of the wiring member increases by separating the first and second outermost pads 140a and 140b from the end of the solar cell by 5 mm to 15 mm. When the separation distance is less than 5 mm, the connection strength of the wiring member is reduced. Further, when the separation distance is greater than 15 mm, an electricity generation area of the solar cell decreases.

The above embodiments of the invention were described using the bifacial solar cell as an example. Hereinafter, the embodiment of the invention is described using a back contact solar cell, in which all of electrodes are positioned on a back surface of the solar cell, as an example.

Figure 20:
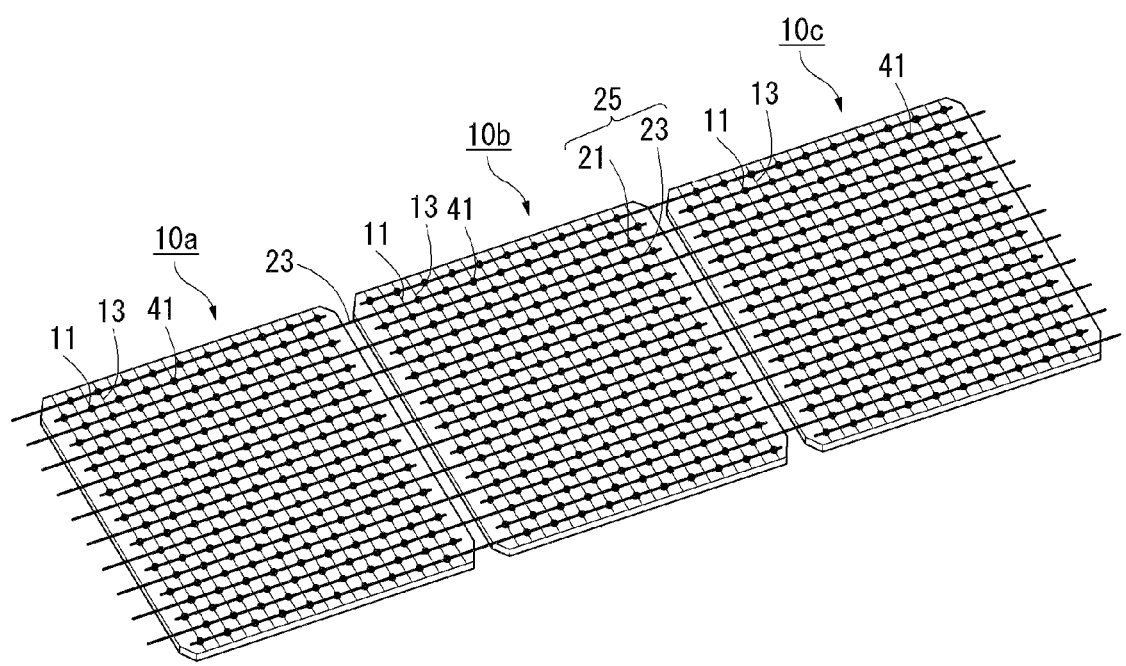
FIG. 20 shows an entire shape of a solar cell module including a back contact solar cell according to another embodiment of the invention.
Figure 21:
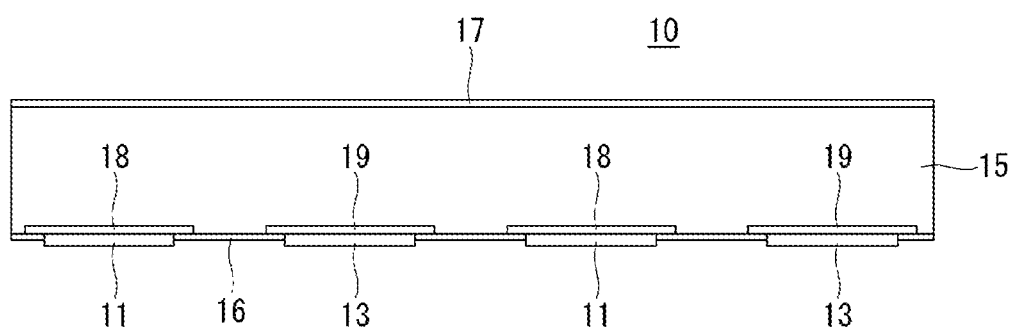
FIG. 21 is a cross-sectional view of a solar cell shown in FIG. 20.

FIG. 20 shows an entire shape of a solar cell module including a back contact solar cell according to another embodiment of the invention. FIG. 21 is a cross-sectional view of a solar cell shown in FIG. 20.

In the embodiment of the invention, each solar cell 10 has a regular hexahedron shape having a thin thickness. First electrodes 11 and second electrodes 13, which respectively collect electrons and holes, are formed on one surface (for example, a back surface of a substrate) of the solar cell 10.

The first electrodes 11 extend in a longitudinal direction and are arranged in parallel with one another, and the second electrodes 13 extend in the longitudinal direction and are arranged in parallel with one another. The first electrodes 11 and the second electrodes 13 are alternately arranged in a transverse direction and are separated from each other by a uniform distance.

The first electrode 11 and the second electrode 13 are electrically connected to a wiring member 25 and thus are connected to a second electrode 13 or a first electrode 11 of another solar cell adjacent to the solar cell.

The wiring member 25 is disposed in the transverse direction crossing the longitudinal direction of the electrodes 11 and 13 and connects the two adjacent solar cells in series.

The wiring member 25 includes a core layer formed of a metal with the good conductivity and a coating layer formed of a solder material. In the embodiment of the invention, it is preferable, but not required, that the wiring member 25 has a rectangular band shape having a thin thickness and has a rectangular cross section. The wiring member 25 has a line width of 1 mm to 2 mm and a thickness of 50 μm to 150 μm. The wiring member 25 may have a wire shape. Because the solar cell according to the embodiment of the invention is the back contact solar cell, the wiring member is positioned on the back surface of the solar cell. Thus, because a light receiving surface of the solar cell does not decrease due to the wiring member, the wiring member according to the embodiment of the invention is configured as a thin plate shape. Hence, a contact area between the wiring member and the electrode increases, and a contact strength between the wiring member and the electrode increases.

In the embodiment of the invention, the wiring member 25 includes a first wiring member 21 and a second wiring member 23. The first wiring member 21 is physically and electrically connected to first electrodes 11 of a second solar cell 10b, which is positioned in the middle, and also is physically and electrically connected to second electrodes 13 of a third solar cell 10c positioned on one side of the second solar cell 10b, thereby connecting the second solar cell 10b to the third solar cell 10c in series. The second wiring member 23 is physically and electrically connected to second electrodes 13 of the second solar cell 10b, which is positioned in the middle, and also is physically and electrically connected to first electrodes 11 of a first solar cell 10a positioned on the other side of the second solar cell 10b, thereby connecting the second solar cell 10b to the first solar cell 10a in series.

The 12 to 18 first wiring members 21 and the 12 to 18 second wiring members 23 are used to connect the two adjacent solar cells each having the size of 160 mm by 160 mm.

The first wiring members 21 and the second wiring members 23 are alternately arranged in a longitudinal direction and are positioned in parallel with each other.

As described above, because the wiring members 25 are disposed in a direction crossing the electrodes 11 and 13, it is easy to connect the wiring members 25 to the electrodes 11 and 13 and also the alignment between the wiring members 25 and the electrodes 11 and 13 becomes easy. In the embodiment of the invention, the first and second electrodes 11 and 13 are formed on the back surface of the substrate in parallel with each other, and the wiring members 25 are connected to the first and second electrodes 11 and 13 in the direction crossing the first and second electrodes 11 and 13. Therefore, an arrangement deformation direction of the wiring members 25 and an arrangement deformation direction of the first and second electrodes 11 and 13 cross each other. Hence, the solar cell may be protected from a latent stress resulting from the arrangement deformation.

In the embodiment of the invention, the first electrode 11 and one wiring member 25 may be connected to each other through a conductive adhesive portion at a crossing 41 between the first electrode 11 and the one wiring member 25. Further, the second electrode 13 and the other wiring member 25 may be connected to each other through the conductive adhesive portion at a crossing 41 between the second electrode 13 and the other wiring member 25.

The other wiring member 25 connected to the second electrode 13 may be insulated from the first electrode 11 through an insulating adhesive portion at the crossing 41 between the first electrode 11 and the wiring member 25. Further, the one wiring member 25 connected to the first electrode 11 may be insulated from the second electrode 13 through the insulating adhesive portion at the crossing 41 between the second electrode 13 and the wiring member 25.

In the embodiment of the invention, the conductive adhesive portion may be one of a solder paste including a solder, such as lead (Pb) and tin (Sn), and a conductive adhesive formed of an epoxy-based synthetic resin or a silicon-based synthetic resin including conductive particles. The wiring member 25 may be selectively connected to the first electrode 11 or the second electrode 13 through the soldering for combining two basic materials by melting the conductive adhesive portion.

Further, the insulating adhesive portion may be formed of the epoxy-based synthetic resin, the silicon-based synthetic resin, or a ceramic material. The wiring member 25 may be selectively insulated from the first electrode 11 or the second electrode 13 through the insulating adhesive portion.

In FIG. 20, a point marked at a crossing indicates a contact point 41, to which the wiring member 25 and the electrodes 11 and 13 are connected. The conductive layer and the solder paste are formed along the contact point 41, or the wiring member 25 and the electrodes 11 and 13 are soldered.

As shown in FIG. 21, the solar cell 10 according to the embodiment of the invention is the back contact solar cell, in which all of the first and second electrodes 11 and 13 are formed on a back surface of a semiconductor substrate 15.

The semiconductor substrate 15 forms a p-n junction. Thin layers 16 and 17, which prevent or reduce the reflection of light and perform a passivation function, are respectively formed on a front surface (on which light is incident) and the back surface (positioned opposite the front surface) of the semiconductor substrate 15.

A thin emitter region 18 and a thin back surface field region 19 are respectively formed between the first electrode 11 and the semiconductor substrate 15 and between the second electrode 13 and the semiconductor substrate 15 and make it easy for carriers to be collected at the electrodes 11 and 13.

In the solar cell module shown in FIG. 20, the wiring members connect the two adjacent solar cells. However, in a solar cell module shown in FIG. 22, the wiring members may be positioned on each solar cell, and the two adjacent solar cells may be connected to each other using a connector CN.

More specifically, in a second solar cell 10b, a first wiring member 211 is connected to a first electrode 11, and a second wiring member 231, which is adjacent to the first wiring member 211 and is positioned in parallel with the first wiring member 211, is connected to a second electrode 13. In a third solar cell 10c, a first wiring member 211 is connected to a second electrode 13, and a second wiring member 231, which is adjacent to the first wiring member 211 and is positioned in parallel with the first wiring member 211, is connected to a first electrode 11.

Figure 22:
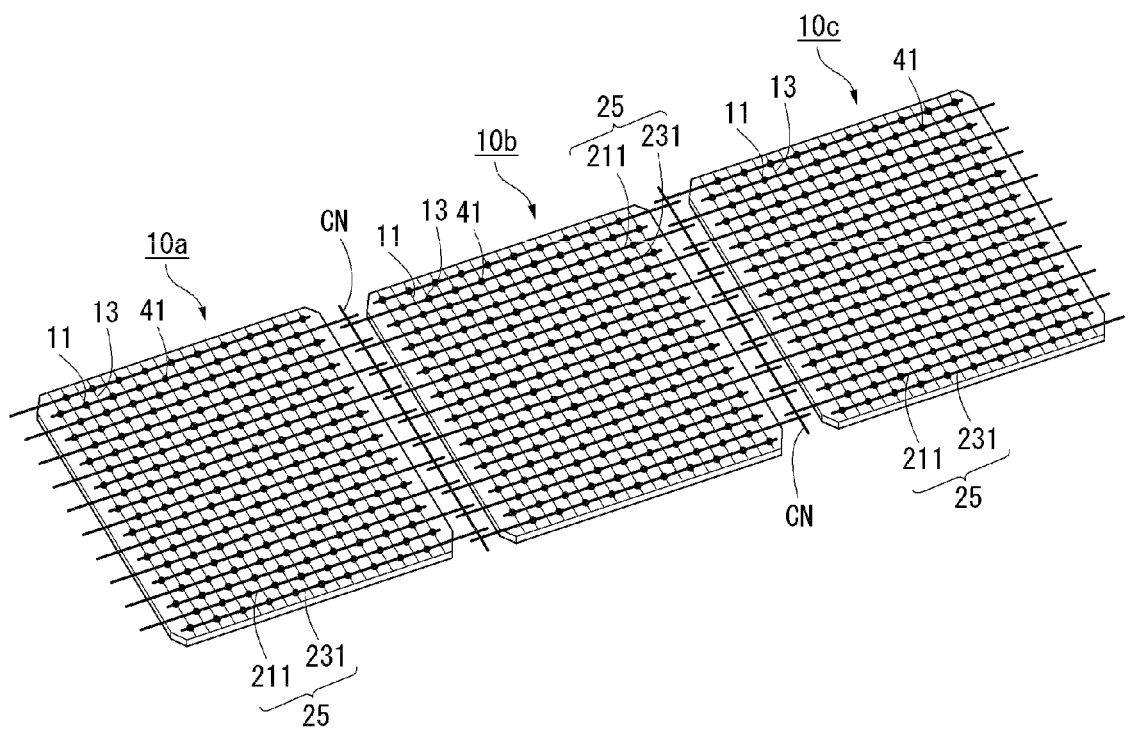
FIG. 22 shows that two adjacent solar cells are connected to each other through a connector.

In the solar cell module shown in FIG. 22, the first wiring member 211 of the second solar cell 10b protrudes toward the third solar cell 10c, and the first wiring member 211 of the third solar cell 10c protrudes toward the second solar cell 10b. Hence, the first wiring member 211 of the second solar cell 10b and the first wiring member 211 of the third solar cell 10c overlap each other in a space between the second solar cell 10b and the third solar cell 10c.

The connector CN extends in a direction crossing the first wiring members 211, is positioned between the second solar cell 10b and the third solar cell 10c, and is physically and electrically connected to the overlapping first wiring members 211. In a preferable example, the connector CN is configured as the wiring member or is formed of a metal material with the conductivity and is physically and electrically connected to the first wiring members 211 through the solder paste, the conductive layer, or the soldering.

Since a first solar cell 10a and the second solar cell 10b are connected through the connector CN in the same manner as the second and third solar cells 10b and 10c, a further description thereof may be briefly made or may be entirely omitted.

Figure 23:
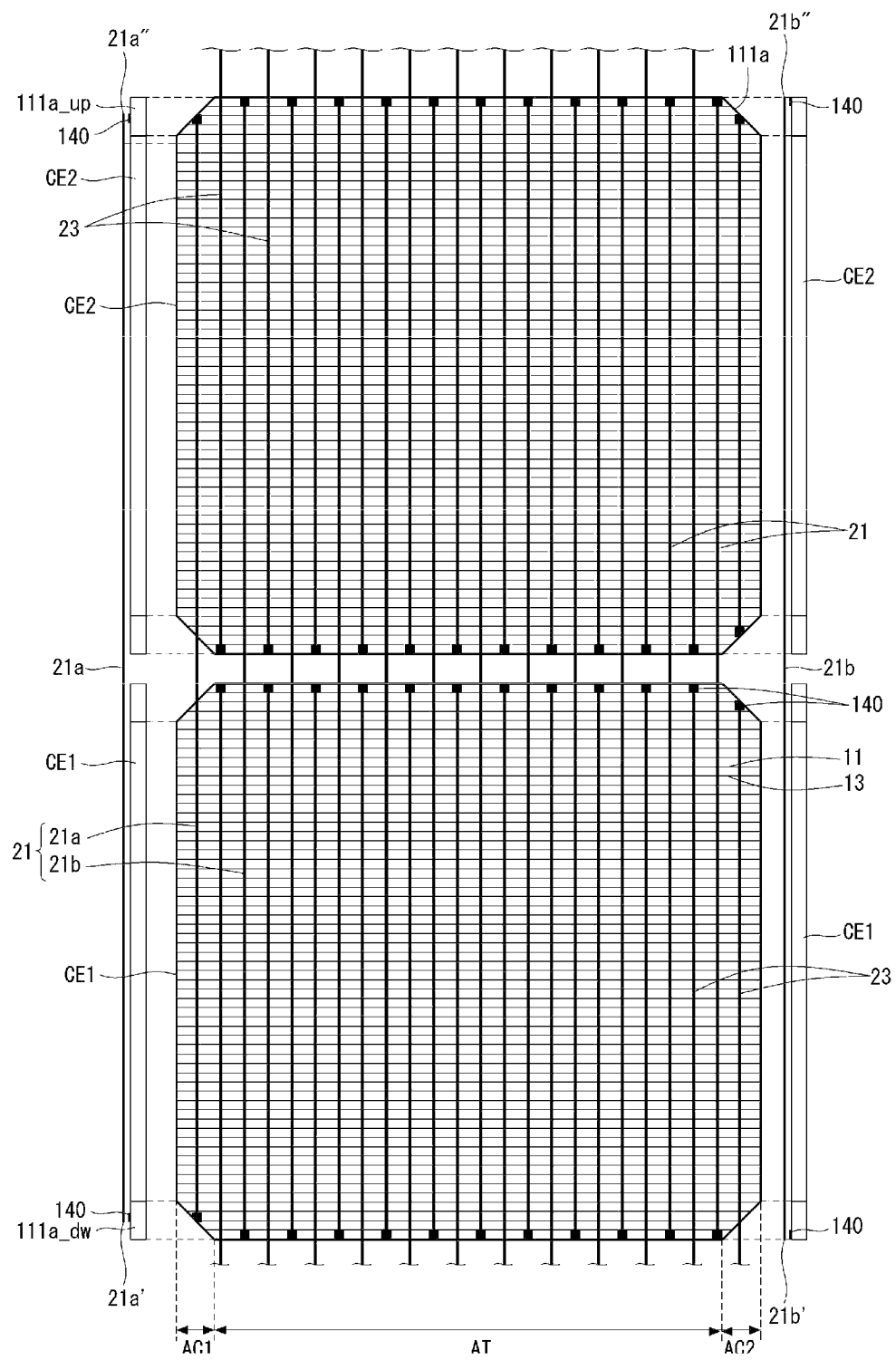
FIG. 23 is a plane view, in which two adjacent solar cells in a solar cell module shown in FIG. 20 are connected to each other through a wiring member.

The connection between the solar cells and the wiring member in the solar cell module shown in FIG. 20 is described below with reference to FIG. 23. FIG. 23 is a plane view, in which the two adjacent solar cells in the solar cell module shown in FIG. 20 are connected to each other through the wiring member.

As shown in FIG. 23, a first solar cell CE1 and a second solar cell CE2 are connected to each other through first wiring members 21. The first wiring member 21 is connected to a first electrode 11 of the first solar cell CE1 and a second electrode 13 of the second solar cell CE2.

A second wiring member 23 is positioned between the first wiring members 21 and is connected to another adjacent solar cell (not shown) in a longitudinal direction of the wiring member.

The first wiring members 21 are divided into corner wiring members 21a positioned in a corner area AC1 including a corner 111a and non-corner wiring members 21b positioned in a non-corner area AT not including the corner 111a depending on a position.

One end 21a' of the corner wiring member 21a is positioned at a lower corner 111a_dw of the first solar cell CE1, and the other end 21a" is positioned at an upper corner 111a_up of the second solar cell CE2.

Because the corner wiring member 21a extends up to an end of the corner 111a as described above, all of the first electrodes 11 and all of the corner wiring members 21a belonging to the corner area AC1 are connected to each other. Hence, the collection efficiency of carriers may increase.

In the same manner as the corner wiring member 21a, one end 21b' of the non-corner wiring member 21b is positioned at an end of the first solar cell CE1, and the other end 21b" is positioned at an end of the second solar cell CE2. Thus, because all of the first electrodes 11 and all of the non-corner wiring members 21b belonging to the non-corner area AT are connected to each other, the collection efficiency of carriers may increase.

As described above, when the end of the wiring member is positioned on the same line as the end of the solar cell, the wiring member may be easily separated from the solar cell. Therefore, a pad 140 may be further formed at the end of the wiring member.

The pad 140 increases an area of the electrode contacting the end of the wiring member and prevents the separation of the wiring member. The pad 140 may be formed of the same material as the electrode or may be formed of a material different from the electrode.

The solder paste or the conductive layer is positioned between the pad 140 and the wiring member and may strongly attach the wiring member to the pad 140. The wiring member may be selectively soldered to the pad 140.

So far, the embodiments of the invention described the solar cell including the corner as an example. However, the embodiments of the invention may be equally applied to a solar cell having a quadrangular plane not including the corner.

An example of the corner area AC1 in the solar cell module shown in FIG. 22 is described in detail below with reference to FIG. 24.

Figure 24:
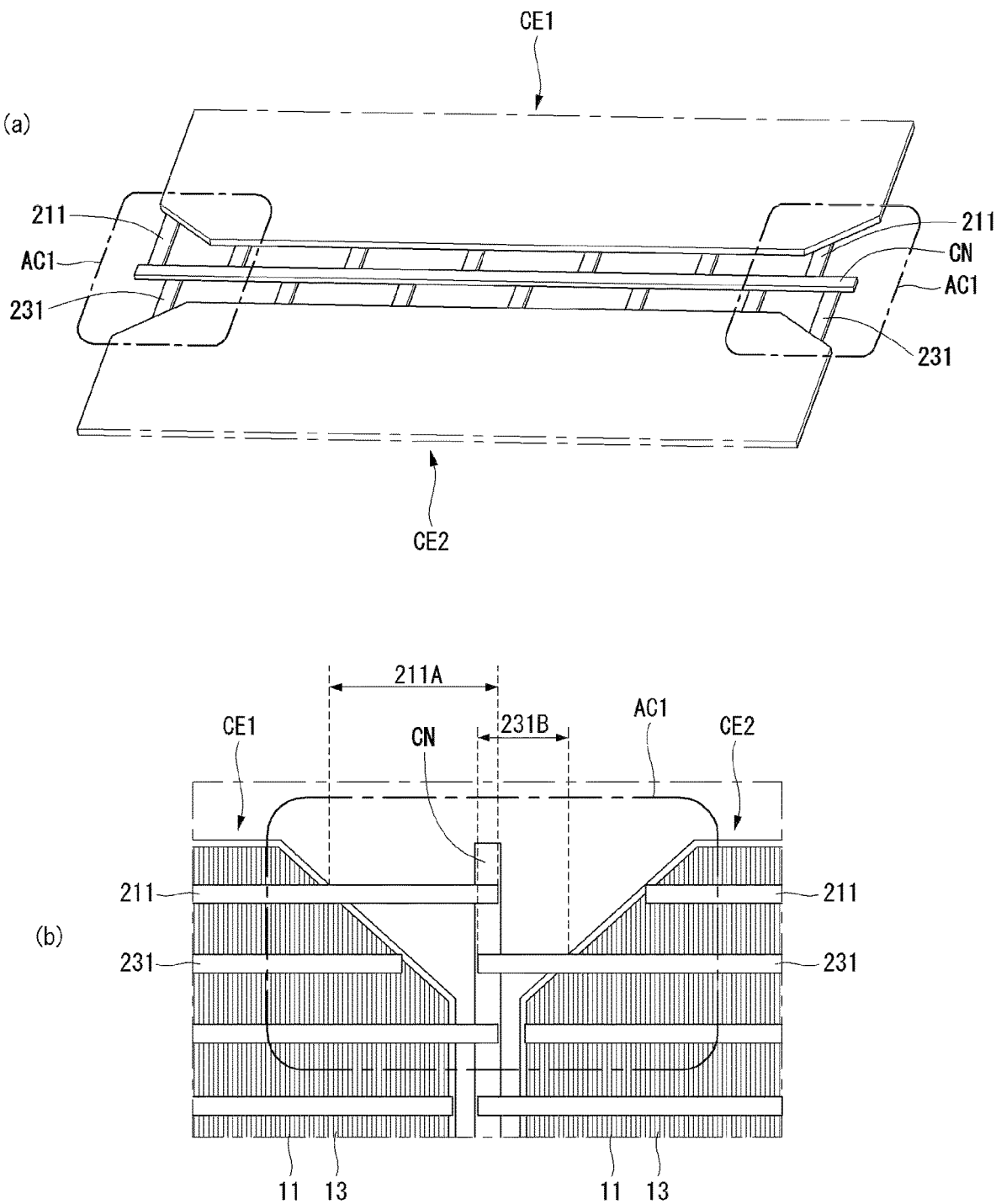
FIG. 24 shows an enlarged view of a portion of a front surface of a solar cell module shown in FIG. 22, and an enlarged view of a portion of a back surface of the solar cell module shown in FIG. 22.

In FIG. 24, (a) is an enlarged view of a portion of the front surface of the solar cell module shown in FIG. 22, and (b) is an enlarged view of a portion of the back surface of the solar cell module shown in FIG. 22.

In (a) and (b) of FIG. 24, the first wiring member 211 may be connected to the first electrodes 11 of the first and second solar cells CE1 and CE2, and the second wiring member 231 may be connected to the second electrodes 13 of the first and second solar cells CE1 and CE2.

The first wiring member 211 of the first solar cell CE1 and the second wiring member 231 of the second solar cell CE2 may be commonly connected to the connector CN, and the first solar cell CE1 and the second solar cell CE2 may be connected in series to each other.

As shown in (a) and (b) of FIG. 24, the first and second wiring members 211 and 231 connected to the first and second solar cells CE1 and CE2 may be positioned even in the corner areas AC1 of the first and second solar cells CE1 and CE2, so as to further increase the transfer efficiency of carriers.

In the instance, as shown in (a) and (b) of FIG. 24, when the two adjacent solar cells are connected to each other through the connector CN, a length 211A of the first wiring member 211, which is connected to the corner area AC1 of the first solar cell CE1 and protrudes to the outside of the first solar cell CE1, may be different from a length 231B of the second wiring member 231, which is connected to the corner area AC1 of the second solar cell CE2 and protrudes to the outside of the second solar cell CE2.

Namely, as shown in (b) of FIG. 24, the length 211A of the first wiring member 211, which is connected to the first solar cell CE1 and protrudes to the outside of the semiconductor substrate of the first solar cell CE1 toward the second solar cell CE2, may be different from the length 231B of the second wiring member 231, which is connected to the second solar cell CE2 and protrudes to the outside of the semiconductor substrate of the second solar cell CE2 toward the first solar cell CE1.

As described above, in the solar cell module according to the embodiment of the invention, when the first wiring member 211 and the second wiring member 231 of the two adjacent solar cells are electrically connected to each other through the connector CN, the first and second wiring members 211 and 231 are positioned even in the corner areas AC1 of the solar cells. In this instance, because the protruding lengths 211A and 231B of the first and second wiring members 211 and 231 are different from each other, the ends of the first and second wiring members 211 and 231 may overlap the connector CN. Hence, the manufacturing process of the solar cell module can be easier, and the efficiency of the solar cell module can be further improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells, each of the plurality of solar cells including a substrate having a first chamfer and a second chamfer, first electrodes extended in a first direction and disposed on a front surface of the substrate and second electrodes disposed on a back surface of the substrate; and
a plurality of wiring members configured to extend second direction crossing to the first direction and electrically connect the first electrodes to the second electrodes of adjacent solar cells, the plurality of wiring members being positioned in parallel with one another and each including a core layer and a coating layer coated on the core layer,
wherein the substrate comprises a first area including the first chamfer, a second area including the second chamfer and a third area between the first area and the second area, the first area and the second area positioned on both sides of the third area in the first direction,
wherein the plurality of wiring members include a first wiring member having a plurality of first wiring members and disposed in each of the first area and the second area and a second wiring member having a plurality of second wiring members and disposed in the third area,
wherein a length of the first wiring member is less than a length of the second wiring member,
wherein the number of the plurality of first wiring members is less the number of the plurality of second wiring members,
wherein each of the plurality of solar cells further comprises:
a plurality of first pads disposed at crossings of the first electrodes wiring member in each of the first area and the second area;
a plurality of second pads disposed at crossings of the first electrodes and the second wiring member in the third area,
wherein a first outermost pad positioned at a top in the second direction among the plurality of first pads and a second outermost pad positioned at the top in the second direction among the plurality of second pads are connected to different first electrodes,
wherein the second outermost pad is connected to a first electrode positioned outside in the second direction than a first electrode to which the first outermost pad is connected among the first electrodes,
wherein the plurality of first pads are connected to one another in the second direction through each of first connection electrodes, and the plurality of second pads are connected to one another in the second direction through each of second connection electrodes, and
wherein lengths of the first connection electrodes are less than lengths of the second connection electrodes.

2. The solar cell module of claim 1, wherein a total number of first and second electrodes connected to the first wiring member is less than a total number of first and second electrodes connected to the second wiring member.

3. The solar cell module of claim 1, wherein an end of the first wiring member is separated from the first and second chamfers by a first distance, and an end of the second wiring member is separated from an end of a solar cell by a second distance, and
wherein the first electrodes and the second electrodes in the first area and the second area extend to the first and second chamfers.

4. The solar cell module of claim 3, wherein the first distance is equal to the second distance.

5. The solar cell module of claim 1, wherein a length of the substrate in the first and second areas is shorter than a length of the substrate in the third area.

6. The solar cell module of claim 1, wherein each of the plurality of wiring members has a wire shape having a circular cross section.

7. The solar cell module of claim 3, wherein the first outermost pad is separated from the first and second chamfers by a third distance, and the second outermost pad is separated from an end of a solar cell by a fourth distance.

8. The solar cell module of claim 7, wherein the third distance is equal to the fourth distance.

9. The solar cell module of claim 8, wherein each of the third distance and the fourth distance is 5 mm to 15 mm.

10. The solar cell module of claim 1, wherein the first connection electrodes are connected to all of the first electrodes existing in the first and second areas, and the second connection electrodes are connected to all of the second electrodes existing in the third area.

11. The solar cell module of claim 9, wherein one connection electrode connects at least one first electrode, which exists between the second outermost pad and the end of the solar cell, to the second outermost pad.

12. The solar cell module of claim 1, further comprising a link electrode configured to extend in an oblique direction and connect at least one first electrode to the second outermost pad,
wherein the link electrode is not overlapped with the plurality of wiring members, and
wherein at least one of the first electrodes is disposed between the second outermost pad and an end of a first solar cell of the plurality of solar cells.

13. The solar cell module of claim 1, wherein the number of the plurality of second wiring members is at least five times more than the number of the plurality of first wiring members.

14. The solar cell module of claim 1, wherein each of the plurality of wiring members is positioned in a middle of each of areas obtained by dividing a width of a first solar cell among the plurality of solar cells into the total number of the plurality of wiring members.

15. The solar cell module of claim 1, wherein each of the plurality of wiring members has a width of about 250 μm to 500 μm.

16. The solar cell module of claim 1, wherein the number of the plurality of wiring members is 6 to 33.

17. The solar cell module of claim 1, wherein the number of the plurality of wiring members is 12.

18. The solar cell module of claim 12, wherein the number of the link electrode connected to one outermost pad is two, and the at least one first electrode and connection electrodes are not disposed between the two link electrodes.

19. The solar cell module of claim 1, wherein a distance between adjacent plurality of wiring members is larger than a distance between an end of a first solar cell among the plurality of solar cells and an end of the first wiring member.

20. The solar cell module of claim 1, wherein the first and second chamfers are formed as a straight line or a curved line.

21. The solar cell module of claim 20, wherein a shape of the substrate is an octagon.

22. The solar cell module of claim 1, wherein some of the plurality of first pads other than the first outermost pad of the plurality of first pads and some of the plurality of second pads other than the second outermost pad of the second pads are positioned on the same first electrode.

23. The solar cell module of claim 1, wherein each of the plurality of the solar cells includes a squared substrate as the substrate.

* * * * *